US010155596B2

(12) United States Patent
Senesac

(10) Patent No.: US 10,155,596 B2
(45) Date of Patent: Dec. 18, 2018

(54) THREE-DIMENSIONAL AIRCRAFT INSPECTION SYSTEM FOR LAYOUT OF PASSENGER ACCOMMODATIONS

(71) Applicant: The Boeing Company, Chicago, IL (US)

(72) Inventor: Christopher J. Senesac, Daniel Island, SC (US)

(73) Assignee: The Boeing Company, Chicago, IL (US)

( * ) Notice: Subject to any disclaimer, the term of this patent is extended or adjusted under 35 U.S.C. 154(b) by 256 days.

(21) Appl. No.: 15/174,354

(22) Filed: Jun. 6, 2016

(65) Prior Publication Data
US 2017/0349300 A1 Dec. 7, 2017

(51) Int. Cl.
G06F 3/0346 (2013.01)
B64F 5/60 (2017.01)
G06F 3/01 (2006.01)
G06F 3/0481 (2013.01)
G06F 3/0484 (2013.01)
(Continued)

(52) U.S. Cl.
CPC .............. B64F 5/60 (2017.01); G06F 3/017 (2013.01); G06F 3/0346 (2013.01); G06F 3/0484 (2013.01); G06F 3/0488 (2013.01); G06F 3/04812 (2013.01); G06F 3/04842 (2013.01); G06F 3/04845 (2013.01); G06F 17/5095 (2013.01); G06Q 10/06 (2013.01); G06Q 10/20 (2013.01); G06F 3/14 (2013.01); G09G 2380/12 (2013.01)

(58) Field of Classification Search
CPC combination set(s) only.
See application file for complete search history.

(56) References Cited

U.S. PATENT DOCUMENTS 6,725,097 B1 * 4/2004 Basile .................... G06Q 10/06
700/1
8,138,938 B2 3/2012 Troy et al.
(Continued)

FOREIGN PATENT DOCUMENTS

EP 2998909 A1 3/2016
WO 2010053809 A1 5/2010

OTHER PUBLICATIONS

Extended European Search Report, dated Oct. 27, 2017, regarding Application No. 17165235.7, 9 pages.

Primary Examiner — Doon Y Chow
Assistant Examiner — Wendy Nicholas
(74) Attorney, Agent, or Firm — Yee & Associates, P.C.

(57) ABSTRACT

A method and apparatus for inspecting an aircraft. The method displays, by a processor unit in a mobile device, a two-dimensional layout of an interior of an aircraft on a graphical user interface on the mobile device in which the two-dimensional layout includes fixed features visible within the interior of the aircraft. The method displays, by the processor unit, a three-dimensional view of a group of objects in the aircraft on the graphical user interface on the mobile device with a point-of-view at a selected distance from an object in the group of objects and in a direction when a fixed feature corresponding to the object is selected from the fixed features in the two-dimensional layout using an input system for the mobile device. The method changes, by the processor unit, the direction of the three-dimensional view in response to movement of the mobile device.

22 Claims, 19 Drawing Sheets

(51) Int. Cl.
*G06F 3/0488* (2013.01)
*G06F 17/50* (2006.01)
*G06Q 10/06* (2012.01)
*G06Q 10/00* (2012.01)
*G06F 3/14* (2006.01)

(56) References Cited

U.S. PATENT DOCUMENTS

| | | | |
|---|---|---|---|
| 8,510,039 B1 | 8/2013 | Troy et al. | |
| 2002/0010655 A1* | 1/2002 | Kjallstrom | G06Q 30/02 705/26.62 |
| 2006/0106682 A1* | 5/2006 | Van Dyck | G06Q 30/02 705/26.5 |
| 2011/0283223 A1* | 11/2011 | Vaittinen | G01C 21/3647 715/781 |
| 2012/0303336 A1* | 11/2012 | Becker | B64F 5/00 703/1 |
| 2013/0159833 A1* | 6/2013 | Look | G06F 3/0481 715/230 |
| 2014/0274138 A1* | 9/2014 | Chao | H04W 4/043 455/456.3 |
| 2014/0298227 A1* | 10/2014 | Gass | G06F 3/0484 715/771 |
| 2014/0310629 A1* | 10/2014 | Senesac | G06Q 10/06 715/771 |
| 2014/0337777 A1 | 11/2014 | Senesac | |

* cited by examiner

THREE-DIMENSIONAL AIRCRAFT INSPECTION SYSTEM FOR LAYOUT OF PASSENGER ACCOMMODATIONS

BACKGROUND INFORMATION

1. Field

The present disclosure relates generally to aircraft and, in particular, to manufacturing aircraft. Still more particularly, the present disclosure relates to a method and apparatus for inspecting the aircraft prior to delivery of the aircraft.

2. Background

Manufacturing an aircraft is an extremely complex process. Hundreds of thousands of parts may be assembled for an aircraft.

The manufacturing of an aircraft may involve manufacturing different parts of the aircraft in geographically diverse locations. These different parts may then be finally assembled in a single location. For example, different portions of a fuselage of the aircraft may be assembled at different locations and flown to a central location where the final assembly line is located. Additionally, other parts, such as engines, auxiliary power units, seats, computer systems, line replaceable units, or other components in the aircraft may be shipped to this final location for assembly to form the assembled aircraft.

When the assembly of the aircraft is completed, the aircraft is moved to a delivery center in which final steps are performed prior to delivering the aircraft to a customer. For example, a preflight phase may occur in which engine runs, airworthiness inspections, avionics testing, preflight servicing, and a first flight occurs. Then, the aircraft may be painted and otherwise finished to the requirements of the customer.

The customer is often heavily involved in the process of delivering the aircraft. For example, the customer often walks through the interior of the aircraft with a manufacturing representative to identify inconsistencies that may need to be rectified. For example, the customer may notice smudges, missing pixels on a display screen, or some other inconsistency that is corrected prior to the customer accepting the aircraft for delivery.

In the inspections performed in passenger and crew areas during the preflight phase and the inspections that occurred during a walk-through with the customer, inconsistencies are noted so that a work order may be created to correct the inconsistencies. The work orders are used by a crew to perform operations to correct the inconsistencies.

These inspections often take more time and effort than desired. For example, identifying the location and part inside of the passenger and crew areas takes more time than desired. Currently, the identification part often involves using painter's tape and marking a number on the part in which an inconsistency is located. Additionally, the part and the location are also entered onto a list. The three-dimensional computer-aided design model of the aircraft is then used to identify the part number. With this information, the work order may be created to resolve the inconsistency.

Currently, this process may take several hours to perform for each inconsistency identified in order to create the work order. As the number of instances increases, the time needed to create work orders increases. This increase in time may result in an increased expense and undesired delays in delivering the aircraft to the customer.

Therefore, it would be desirable to have a method and apparatus that take into account at least some of the issues discussed above, as well as other possible issues. For example, it would be desirable to have a method and apparatus that overcome a technical problem with inspecting the passenger and crew areas of the aircraft to identify the inconsistencies for use in generating the work orders.

SUMMARY

An embodiment of the present disclosure provides an aircraft inspection system. The aircraft inspection system comprises an aircraft inspector. The aircraft inspector is configured to display a two-dimensional layout of an interior of an aircraft on a graphical user interface on a mobile device in which the two-dimensional layout includes a group of fixed features visible within the interior of the aircraft. Further, the aircraft inspector is configured to display a three-dimensional view of a group of objects in the aircraft on the graphical user interface on the mobile device with a point-of-view at a selected distance from an object in the group of objects and in a direction when a fixed feature corresponding to the object is selected from fixed features in the two-dimensional layout using an input system for the mobile device. Yet further, the aircraft inspector is configured to change the direction of the three-dimensional view in response to movement of the mobile device.

Another embodiment of the present disclosure provides an apparatus comprising a mobile device and an aircraft inspector. The aircraft inspector is configured to run on the mobile device. The aircraft inspector is configured to display a two-dimensional layout of an interior of an aircraft on a graphical user interface on the mobile device in which the two-dimensional layout includes fixed features visible within the interior of the aircraft. Further, the aircraft inspector is configured to display a three-dimensional view of a group of objects in the aircraft on the graphical user interface on the mobile device with a point-of-view at a selected distance from an object in the group of objects and in a direction when a fixed feature corresponding to the object is selected from the fixed features in the two-dimensional layout using an input system for the mobile device. Yet further, the aircraft inspector is configured to change the direction of the three-dimensional view in response to receiving a user input at the input system in the mobile device. Still further, the aircraft inspector is configured to receive the user input to the graphical user interface identifying an inconsistency for the object in the group of objects in the three-dimensional view.

Yet another embodiment of the present disclosure provides a method for inspecting an aircraft. The method displays, by a processor unit in a mobile device, a two-dimensional layout of an interior of an aircraft on a graphical user interface on the mobile device in which the two-dimensional layout includes fixed features visible within the interior of the aircraft. Further, the method displays, by the processor unit, a three-dimensional view of a group of objects in the aircraft on the graphical user interface on the mobile device with a point-of-view at a selected distance from an object in the group of objects and in a direction when a fixed feature corresponding to the object is selected from the fixed features in the two-dimensional layout using an input system for the mobile device. Yet further, the method changes, by the processor unit, the direction of the three-dimensional view in response to movement of the mobile device.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives, and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that one issue with inspecting areas where people occupy an aircraft during flight includes identifying a location of a part in a three-dimensional model of the aircraft to identify a part number.

In some cases, an operator processing an inconsistency may be unsure of the location of the part within the three-dimensional model as identified inside of the aircraft during an inspection. As a result, the operator may return to the aircraft to view the location marked with tape or some other type of marking mechanism and then return to the workstation to view the three-dimensional model. Having to return to the aircraft increases the amount of time needed to process the inconsistency.

The illustrative embodiments recognize and take into account that when 50, 80, or 100 inconsistencies are present, the amount of time used to process these inconsistencies may be much greater than desired to finish prepping the aircraft for delivery to a customer. Thus, the illustrative embodiments provide a method and apparatus for inspecting the aircraft. In one illustrative example, operations may be implemented in a mobile device to aid in inspecting an interior of the aircraft. The mobile device is carried into the interior of the aircraft for use during the inspection.

For example, a processor unit in the mobile device displays a two-dimensional layout of the interior of the aircraft on a graphical user interface on the mobile device. The two-dimensional layout includes a group of fixed features visible within the interior of the aircraft. The processor unit displays a three-dimensional view of a group of objects in the aircraft on the graphical user interface on the mobile device with a point-of-view at a selected distance from an object in the group of objects and in a direction when a fixed feature in the fixed features corresponding to the object is selected from the two-dimensional layout using an input system for the mobile device. The processor unit changes the direction of the three-dimensional view in response to movement of the mobile device.

Additionally, information about inconsistencies may be entered using the mobile device during the inspection within the aircraft. As depicted, the location and identification of the part may be made using the three-dimensional view of objects representing parts. The three-dimensional view is a view of the three-dimensional model for the aircraft. As a result, the identification of the part may be made more quickly and accurately within the aircraft using the mobile device.

As used herein, "a group of", when used in reference to items, means one or more items. For example, "a group of objects" is one or more objects.

Figure 1:
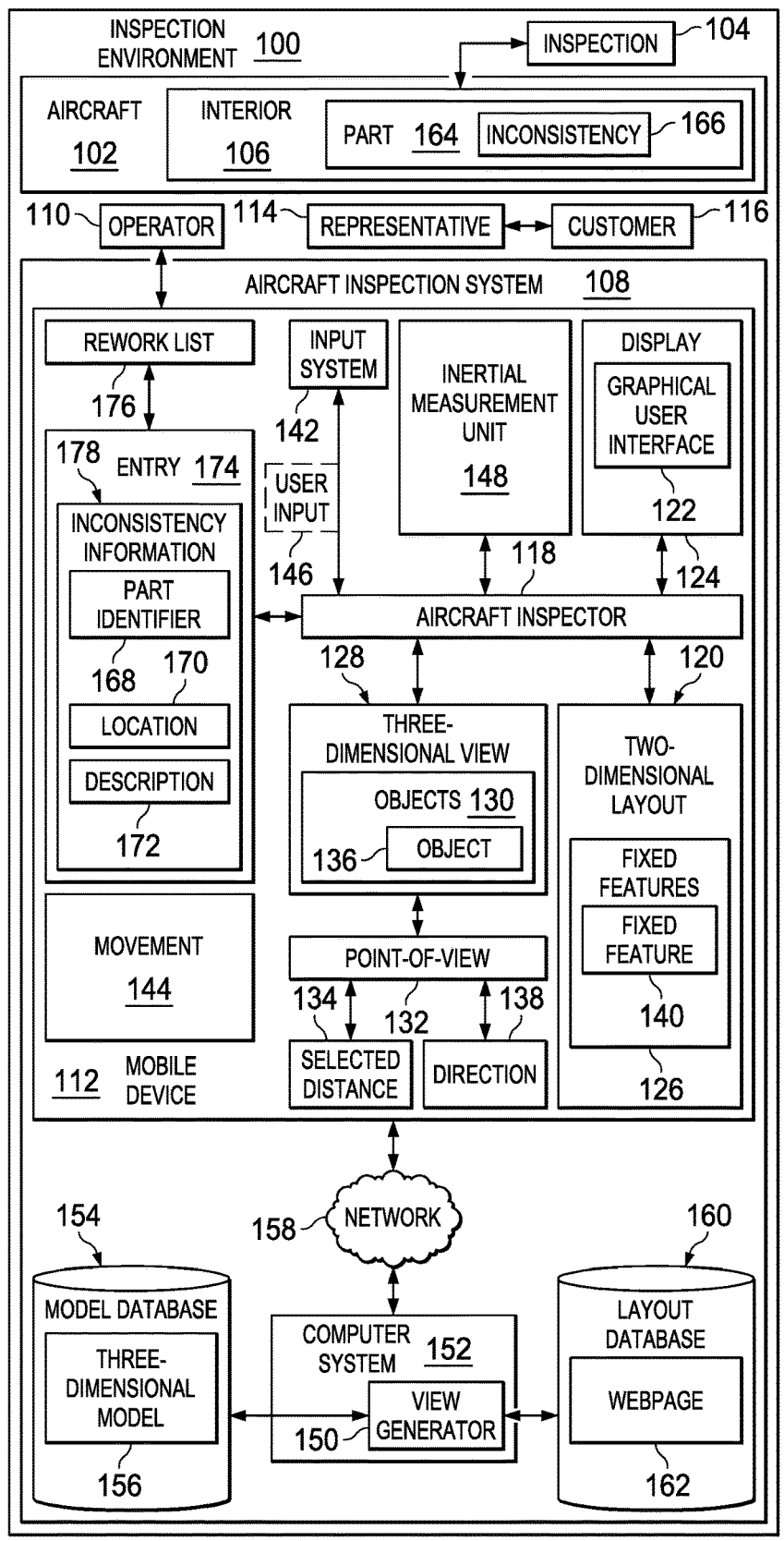
FIG. 1 is an illustration of a block diagram of an inspection environment in accordance with an illustrative embodiment.

With reference now to the figures and, in particular, with reference to FIG. 1, an illustration of a block diagram of an inspection environment is depicted in accordance with an illustrative embodiment. As depicted, inspection environment 100 is an environment in which inspection 104 of aircraft 102 may be performed. More specifically, inspection 104 may be performed on interior 106 of aircraft 102.

In this illustrative example, interior 106 of aircraft 102 comprises areas in which people may be present in aircraft 102 during operation of aircraft 102. For example, interior 106 may include at least one of a passenger area, a crew area, a flight deck, or some other area in which a person may be present during the operation of aircraft 102. In one illustrative example, interior 106 may be a layout of passenger accommodations (LOPA) as defined by the Federal Aviation Agency (FAA). For example, interior 106 may include areas where passenger and flight attendant seats, emergency equipment, exits, lavatories, and galleys are located.

Inspection 104 may be performed more efficiently using aircraft inspection system 108. As depicted, operator 110 carries mobile device 112 into interior 106 of aircraft 102 to perform inspection 104.

Operator 110 is a person. In this illustrative example, mobile device 112 is any physical hardware device that is configured to process data. For example, mobile device 112 may be selected from one of a handheld device, a mobile phone, a tablet computer, a laptop computer, a subnotebook, a convertible laptop computer, a netbook, or some other suitable device that may be carried by operator 110. In some illustrative examples, mobile device 112 may be a handheld device that is small enough to be held in a single hand of operator 110 during use of mobile device 112. As depicted, operator 110 may be accompanied by representative 114 for customer 116 to perform inspection 104 as part of a walk-through of aircraft 102 with representative 114 prior to customer 116 approving delivery of aircraft 102.

In this illustrative example, aircraft inspection system 108 includes aircraft inspector 118. In this illustrative example, aircraft inspector 118 is located in mobile device 112.

Aircraft inspector 118 may be implemented in software, hardware, firmware, or a combination thereof. When software is used, the operations performed by aircraft inspector 118 may be implemented in program code configured to run on hardware, such as a processor unit. When firmware is used, the operations performed by aircraft inspector 118 may be implemented in program code and data and stored in persistent memory to run on a processor unit. When hardware is employed, the hardware may include circuits that operate to perform the operations in aircraft inspector 118.

In the illustrative examples, the hardware may take a form selected from at least one of a circuit system, an integrated circuit, an application specific integrated circuit (ASIC), a programmable logic device, or some other suitable type of hardware configured to perform a number of operations. With a programmable logic device, the device may be configured to perform a number of operations. The device may be reconfigured at a later time or may be permanently configured to perform the number of operations. Programmable logic devices include, for example, a programmable logic array, a programmable array logic, a field programmable logic array, a field programmable gate array, and other suitable hardware devices. Additionally, the processes may be implemented in organic components integrated with inorganic components and may be comprised entirely of organic components, excluding a human being. For example, the processes may be implemented as circuits in organic semiconductors.

In this illustrative example, aircraft inspector 118 displays two-dimensional layout 120 of interior 106 of aircraft 102 in graphical user interface 122 on display 124 on mobile device 112. Display 124 is a device that displays information to a person. Display 124 may be, for example, a light-emitting diode (LED) display, an organic light-emitting diode (OLED) display, a liquid crystal display (LCD), or some other suitable type of device for visually displaying information.

As depicted, two-dimensional layout 120 includes a group of fixed features 126 visible within interior 106 of aircraft 102. In other words, a group of fixed features 126 is features that can be seen by a viewer within interior 106 of aircraft 102.

Aircraft inspector 118 displays three-dimensional view 128 of a group of objects 130 in aircraft 102 in graphical user interface 122 on display 124 on mobile device 112 with point-of-view 132 at selected distance 134 from object 136 in the group of objects 130. Three-dimensional view 128 at point-of-view 132 is in direction 138. This display of three-dimensional view 128 occurs when fixed feature 140 in fixed features 126 is selected from two-dimensional layout 120.

The selection of fixed feature 140 is made using input system 142 for mobile device 112. Input system 142 may be selected from at least one of a touchscreen, a trackball, a camera, or some other device that may be located in or used with mobile device 112.

Aircraft inspector 118 changes direction 138 of three-dimensional view 128 at point-of-view 132 in response to movement 144 of mobile device 112. Further, a change of direction 138 from point-of-view 132 in three-dimensional view 128 may be made in response to user input 146 being generated by operator 110 using input system 142. In the illustrative example, at least one of movement 144 of mobile device 112 or user input 146 may be used by aircraft inspector 118 to change direction 138 of three-dimensional view 128 from point-of-view 132.

As used herein, the phrase "at least one of," when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

In this illustrative example, movement 144 of mobile device 112 may be detected using inertial measurement unit 148 associated with mobile device 112. Movement 144 may be a change in orientation and may also include a translation of mobile device 112. Inertial measurement unit 148 is a hardware device that may be used to detect movement 144 of mobile device 112. Inertial measurement unit 148 includes components selected from at least one of an accelerometer, a gyroscope, a magnetometer, or other suitable components that may be used to measure parameters, such as force, angular rate, magnetic field, or other suitable parameters that may be used to detect movement 144.

When one component is "associated" with another component, the association is a physical association. For example, a first component, such as inertial measurement unit 148, may be considered to be physically associated with a second component, such as mobile device 112, by at least one of being secured to the second component, bonded to the second component, mounted to the second component, welded to the second component, fastened to the second component, or connected to the second component in some other suitable manner. The first component also may be connected to the second component using a third component. The first component may also be considered to be physically associated with the second component by being formed as part of the second component, an extension of the second component, or both. In this example, inertial measurement unit 148 may be removably associated with mobile device 112. In other words, inertial measurement unit 148 may be attached to and detached from mobile device 112.

In this illustrative example, three-dimensional view 128 is received from computer system 152 in aircraft inspection system 108. View generator 150 in computer system 152 accesses model database 154 to obtain three-dimensional model 156 for aircraft 102. In the illustrative example, a database is a collection of data including objects, such as computer-aided design models.

View generator 150 may be a computer-aided design (CAD) application or other modeling software. View generator 150 generates three-dimensional view 128 using three-dimensional model 156 and sends three-dimensional view 128 to aircraft inspector 118 on mobile device 112 over network 158. In this illustrative example, network 158 includes wireless connections that are used by mobile device 112.

Computer system 152 is a physical hardware system and includes one or more data processing systems. When more than one data processing system is present, those data processing systems are in communication with each other using a communications medium. The communications medium may be a network. The data processing systems may be selected from at least one of a computer, a server computer, a tablet, or some other suitable data processing system.

Additionally, view generator 150 also accesses layout database 160 to locate webpage 162. Webpage 162 is sent to aircraft inspector 118, which displays two-dimensional layout 120 using webpage 162. In this illustrative example, webpage 162 may be in hypertext markup language, extensible markup language, or some other suitable language. Additionally, webpage 162 may be dynamically generated in some illustrative examples.

In this illustrative example, webpage 162 may be sent while mobile device 112 is located in or near aircraft 102. In another illustrative example, webpage 162 may be preloaded onto mobile device 112. For example, multiple webpages may be preloaded onto mobile device 112 such that an appropriate webpage may be used to display a two-dimensional layout for a particular type of aircraft as needed.

As depicted, object 136 may be selected when part 164 in aircraft 102 corresponding to object 136 has inconsistency 166. As depicted, inconsistency 166 may be a smudge, an incorrect color, a defect, an inoperative display, or some other type of inconsistency that does not comply with the specifications for aircraft 102.

The selection of object 136 by view generator 150 is used to identify part 164 for aircraft 102 in three-dimensional model 156 that corresponds to object 136 in three-dimensional view 128. The selection may be used to obtain part identifier 168 as well as location 170 for part 164 in three-dimensional model 156. In this illustrative example, location 170 is coordinates for part 164 in aircraft 102. The coordinates may be for the Cartesian coordinate system or some other suitable type of coordinate system.

Additionally, graphical user interface 122 may receive description 172 of inconsistency 166 using input system 142. With description 172 entered by operator 110, aircraft inspector 118 generates entry 174 for rework list 176. Entry 174 comprises inconsistency information 178. Inconsistency information 178 includes part identifier 168, location 170, and description 172.

Rework list 176 may be used to generate work orders for a punch list for resolving inconsistencies that may be identified in interior 106 of aircraft 102. In this manner, inspection 104 of aircraft 102 may be performed more quickly as compared to currently used processes.

In one illustrative example, one or more technical solutions are present that overcome a technical problem with inspecting the passenger and crew areas of an aircraft to identify inconsistencies for use in generating work orders. As a result, one or more technical solutions may provide a technical effect, thus reducing the time needed to identify the inconsistencies in interior 106 of aircraft 102 using aircraft inspection system 108 in which operator 110 may carry mobile device 112 into interior 106 of aircraft 102 and use aircraft inspector 118 running on mobile device 112 to identify information about the inconsistencies for use in creating work orders or other instructions to remedy those inconsistencies.

Further, one or more technical solutions provide an ability to correlate object 136 in three-dimensional view 128 of interior 106 of aircraft 102 back to three-dimensional model 156. In particular, identification of part identifier 168 and location 170 of part 164 represented by object 136 in three-dimensional view 128 may be identified using aircraft inspector 118 and view generator 150. Thus, aircraft inspection system 108 functions as a three-dimensional aircraft inspection system for interior 106 of aircraft 102.

Further, one or more technical solutions allow entering of description 172 of inconsistency 166. This information may be used to create inconsistency information 178 more quickly than using currently available techniques.

As a result, mobile device 112 and computer system 152 operate as a special purpose system in which at least one of aircraft inspector 118 on mobile device 112 or view generator 150 in computer system 152 enables identifying the inconsistencies in interior 106 of aircraft 102 during inspection 104 of aircraft 102. In particular, at least one of aircraft inspector 118 on mobile device 112 or view generator 150 in computer system 152 forms into a special purpose system as compared to currently available general computer systems that do not have these components.

Figure 2:
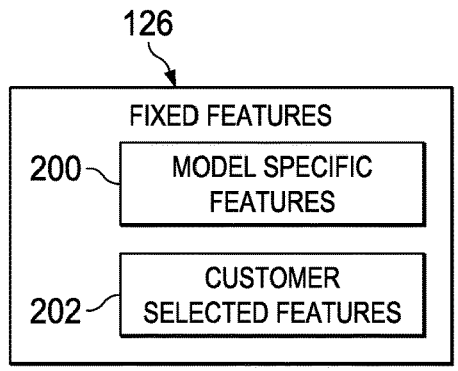
FIG. 2 is an illustration of a block diagram of types of fixed features in accordance with an illustrative embodiment.

With reference next to FIG. 2, an illustration of a block diagram of types of fixed features is depicted in accordance with an illustrative embodiment. In the illustrative examples, the same reference numeral may be used in more than one figure. This reuse of a reference numeral in different figures represents the same element in the different figures.

In the illustrative example, fixed features 126 used in two-dimensional layout 120 in FIG. 1 may take different forms. For example, fixed features 126 may be selected from at least one of model specific features 200 or customer selected features 202.

In this illustrative example, model specific features 200 are fixed features 126 found in a particular model of aircraft 102 in FIG. 1 offered by an aircraft manufacturer. For example, model specific features 200 may include fuselage doors, windows, or other fixed features in aircraft 102 that do not vary within a model.

As depicted, customer selected features 202 are fixed features 126 that are selected by customer 116 in FIG. 1 for a group of commercial airplanes of a particular model as ordered by customer 116. In other words, customer selected features 202 do not vary within the group of commercial airplanes for that model. Customer selected features 202 in the group of commercial airplanes for customer 116 may vary from the commercial airplanes of the same model as ordered by another customer.

Figure 3:
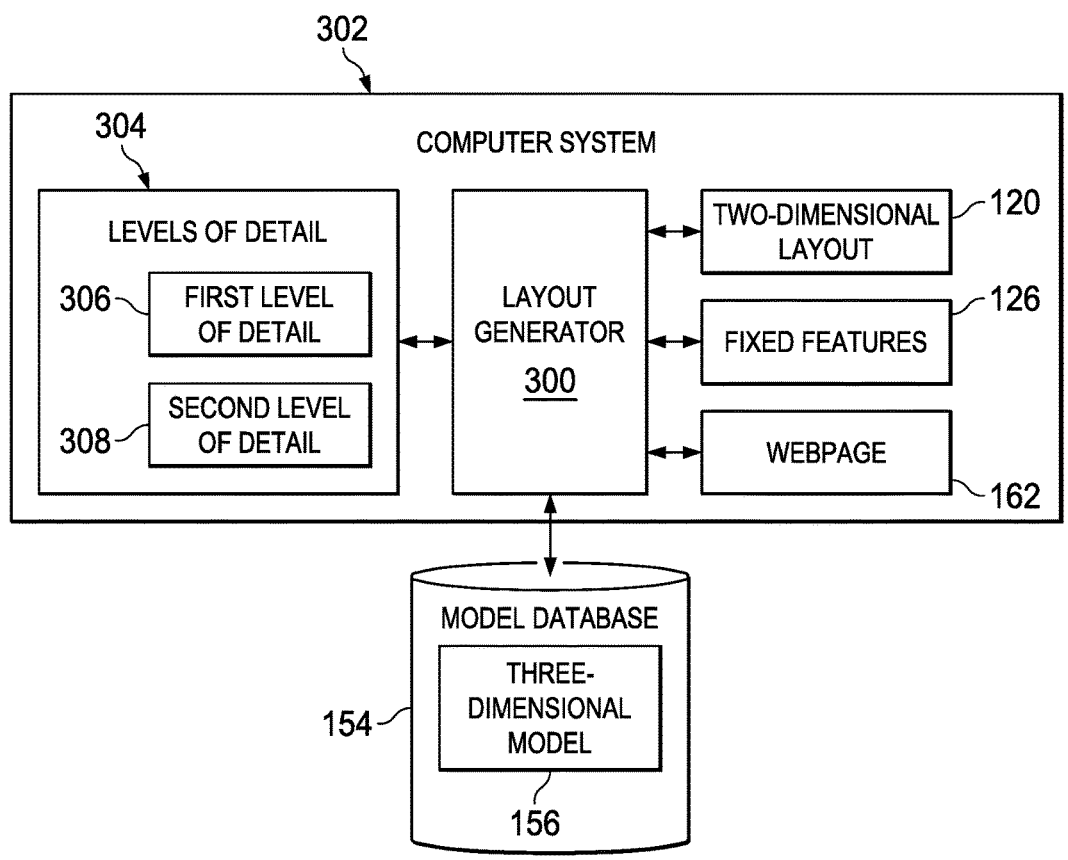
FIG. 3 is an illustration of a data flow diagram for creating a two-dimensional layout in accordance with an illustrative embodiment.

Turning to FIG. 3, an illustration of a data flow diagram for creating a two-dimensional layout is depicted in accordance with an illustrative embodiment. As depicted in this figure, layout generator 300 running on computer system 302 creates two-dimensional layout 120 for display on mobile device 112 in FIG. 1.

In this illustrative example, layout generator 300 creates webpage 162 that is processed by a data processing system, such as mobile device 112 in FIG. 1, to display two-dimensional layout 120. Webpage 162 is created by layout generator 300 using three-dimensional model 156 in model database 154. Layout generator 300 may store webpage 162 in layout database 160 in FIG. 1.

As depicted, layout generator 300 identifies fixed features 126 in interior 106 of aircraft 102 in FIG. 1 using three-dimensional model 156. A group of fixed features 126 is included in two-dimensional layout 120.

Additionally, layout generator 300 identifies levels of detail 304 for two-dimensional layout 120. For example, levels of detail 304 may include first level of detail 306 for two-dimensional layout 120 that is less than second level of detail 308 for two-dimensional layout 120.

In the illustrative example, first level of detail 306 is initially displayed by mobile device 112 in FIG. 1 with second level of detail 308 being displayed when a portion of two-dimensional layout 120, displayed in first level of detail 306, is selected. In this example, layout generator 300 creates webpage 162 with the group of fixed features 126 that is identified and levels of detail 304.

Figure 4:
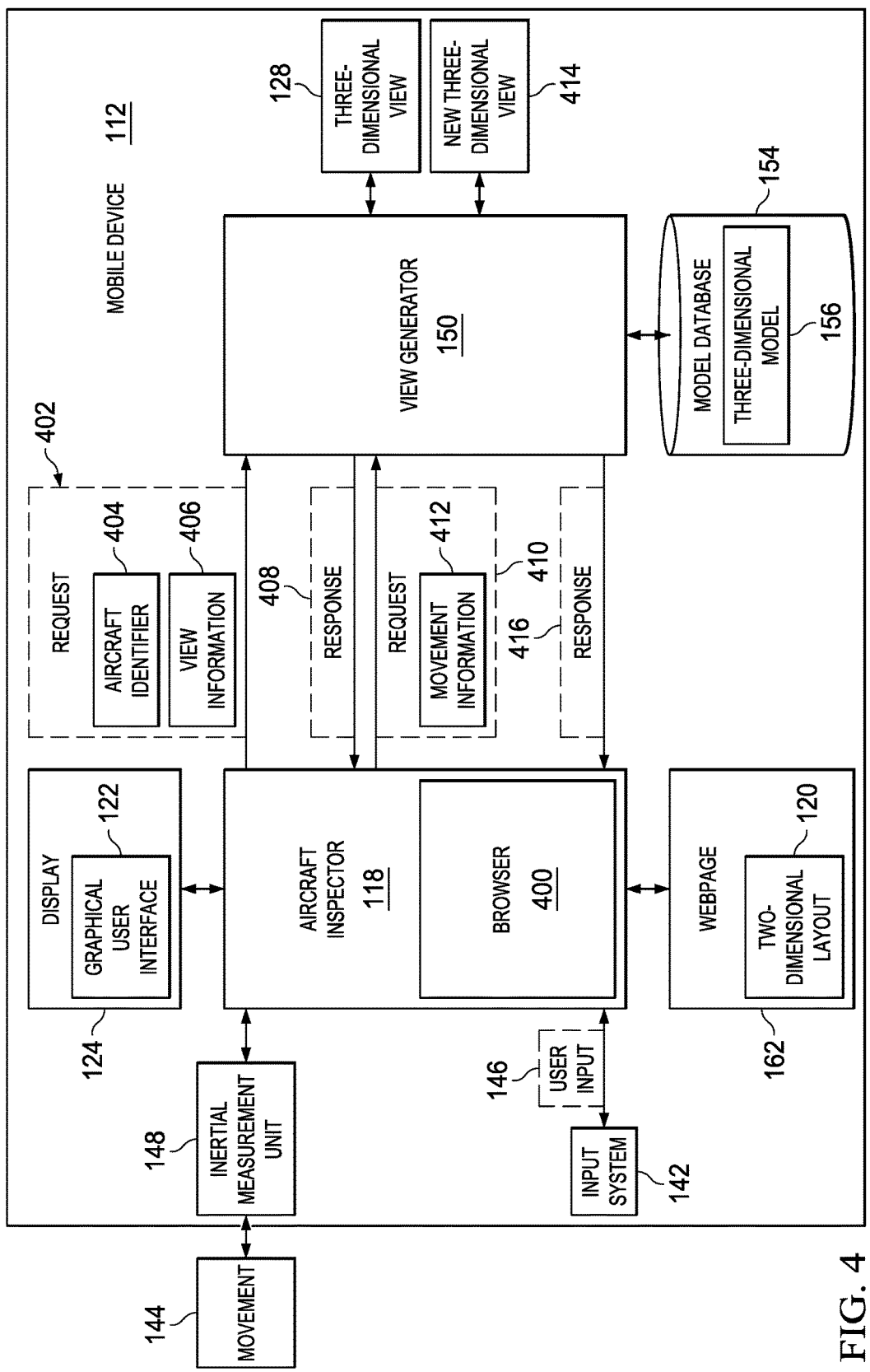
FIG. 4 is an illustration of a data flow diagram for displaying a three-dimensional view of an interior of an aircraft in accordance with an illustrative embodiment.

With reference now to FIG. 4, an illustration of a data flow diagram for displaying a three-dimensional view of an interior of an aircraft is depicted in accordance with an illustrative embodiment. As depicted, mobile device 112 has received webpage 162 and displays two-dimensional layout 120 on display 124 on mobile device 112 using webpage 162. This processing of webpage 162 occurs using aircraft inspector 118 on mobile device 112. In this illustrative example, aircraft inspector 118 may be browser 400 or may include browser 400 as a component within aircraft inspector 118. As depicted, browser 400 is a software application that retrieves, presents, and otherwise processes information, such as webpage 162.

In this illustrative example, view generator 150 and model database 154 are located in mobile device 112. As a result, communications between aircraft inspector 118 in view generator 150 do not require a network, wireless communications links, or other communications media outside of mobile device 112. The same hypertext transfer protocol (HTTP) requests and responses may be sent between aircraft inspector 118 and view generator 150 all within mobile device 112. This type of implementation may be used when mobile device 112 has storage and processing resources that provide a desired level of performance in generating and displaying three-dimensional view 128.

In response to a selection of one of a group of fixed features 126 in FIG. 1 displayed in two-dimensional layout 120, aircraft inspector 118 on mobile device 112 sends request 402 to view generator 150. Request 402 may take different forms. In this illustrative example, request 402 may be a hypertext transfer protocol (HTTP) call. In this example, request 402 includes aircraft identifier 404 and view information 406 obtained from webpage 162.

View generator 150 uses request 402 to identify three-dimensional model 156 as the correct model to use in model database 154. View generator 150 generates three-dimensional view 128 using view information 406 received in request 402. For example, three-dimensional view 128 may be an image. Further, selectable sections may be present within the image. View generator 150 sends three-dimensional view 128 to aircraft inspector 118 for display in graphical user interface 122 on display 124 on mobile device 112 in response 408.

In this illustrative example, three-dimensional view 128 may be displayed in graphical user interface 122 on display 124 when fixed feature 140 in fixed features 126 in FIG. 1 is selected in two-dimensional layout 120. Both three-dimensional view 128 and two-dimensional layout 120 may also be displayed in graphical user interface 122 on display 124 at the same time. When at least one of movement 144 of mobile device 112 or user input 146 is detected by mobile device 112 through at least one of inertial measurement unit 148 or input system 142, aircraft inspector 118 sends request 410 to view generator 150.

In this illustrative example, request 410 includes movement information 412. Movement information 412 may include at least one of movement 144, as detected by inertial measurement unit 148, or user input 146, as generated by input system 142. View generator 150 changes three-dimensional view 128 using movement information 412 to form new three-dimensional view 414.

As depicted, view generator 150 returns new three-dimensional view 414 to aircraft inspector 118 in response 416. In this manner, aircraft inspector 118 may change direction 138 in FIG. 1 of three-dimensional view 128.

Figure 5:
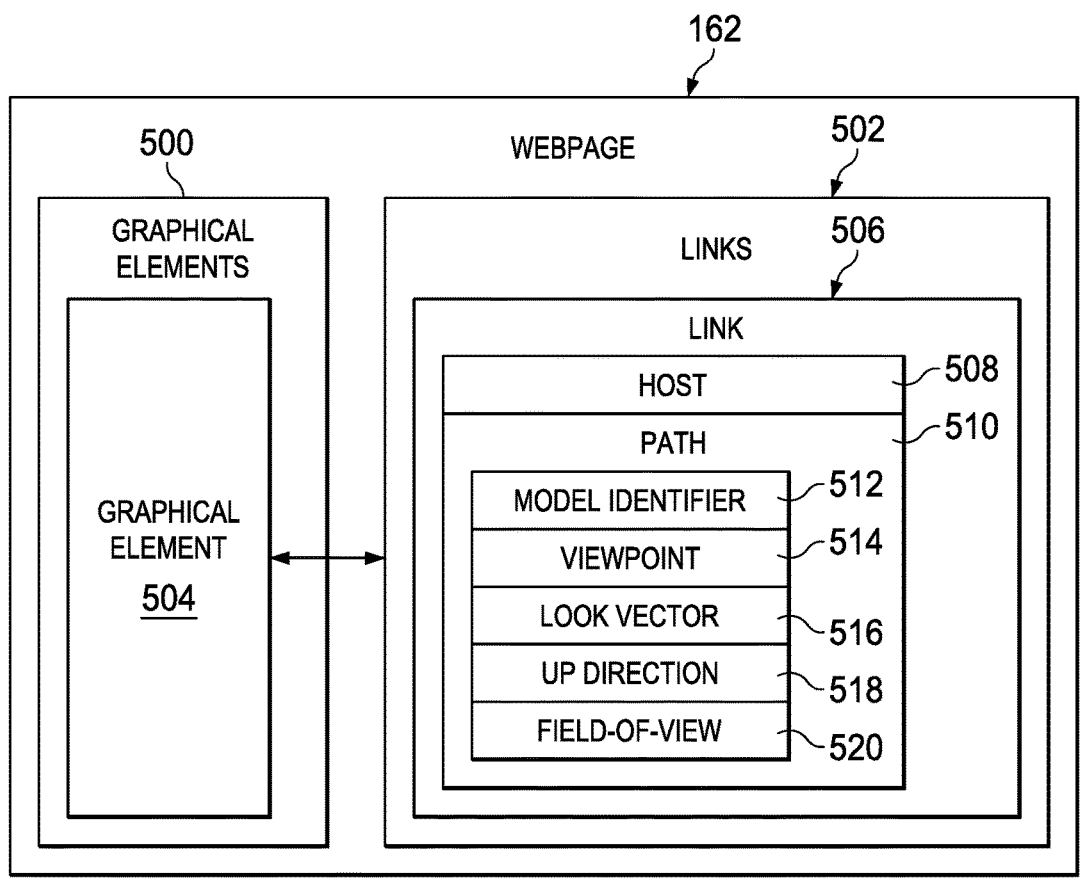
FIG. 5 is an illustration of a block diagram of a webpage for displaying a two-dimensional layout in accordance with an illustrative embodiment.

With reference now to FIG. 5, an illustration of a block diagram of a webpage for displaying a two-dimensional layout is depicted in accordance with an illustrative embodiment. In this illustrative example, an example of content in webpage 162 that is used to display two-dimensional layout 120 in FIG. 1 is shown. In this illustrative example, webpage 162 includes graphical elements 500 and links 502.

In this illustrative example, graphical elements 500 represent a group of fixed features 126 in two-dimensional layout 120 in FIG. 1. Graphical elements 500 also may include other structures in interior 106 of aircraft 102 in FIG. 1 that may not be selectable, such as usage of walls, bulkheads, or other structures.

Links 502 are used to reference information that operator 110 using mobile device 112 in FIG. 1 may follow and view. The group of graphical elements 500 that represents the group of fixed features 126 in FIG. 1 may be icons or pictograms that incorporate the group of links 502 such that a selection of the group of graphical elements 500 allows for accessing information referenced by the group of links 502.

In this illustrative example, graphical element 504 in the group of graphical elements 500 corresponds to fixed feature 140 in fixed features 126 in FIG. 1. Graphical element 504 references or includes link 506 in the group of links 502. As depicted, link 506 includes host 508 and path 510. Host 508 identifies a destination or source for the information requested. For example, host 508 may be a registered name, an Internet protocol (IP) address, or some other suitable type of identifier.

Path 510 is in a hierarchical form and also may include parameters. In this illustrative example, path 510 includes model identifier 512, viewpoint 514, look vector 516, up direction 518, and field-of-view 520.

Model identifier 512 identifies the three-dimensional model that is to be used to generate the three-dimensional view. Viewpoint 514 is coordinates identifying the eye point or point-of-view from which the three-dimensional view is generated. Look vector 516 is a vector that identifies a direction for the three-dimensional view from the point-of-view. Up direction 518 is a vector that identifies the direction that is up. Field-of-view 520 is a number of degrees for the field-of-view for the three-dimensional view.

The illustration of inspection environment 100 and the different components illustrated in FIGS. 1-5 are not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, in FIG. 1, inspection 104 is described with respect to finalizing the preparation of aircraft 102 for delivery to the customer. Aircraft inspection system 108 may also be used after aircraft 102 has been delivered to customer 116. For example, aircraft inspection system 108 may be used by customer 116 to perform maintenance on aircraft 102. For example, inconsistencies may be identified during maintenance and inspections to determine what maintenance may be needed for aircraft 102.

In another illustrative example, two-dimensional layout 120 may only have a single level of detail. As yet another example, webpage 162 for displaying two-dimensional layout 120 may be created without using three-dimensional model 156. Instead, a programmer or some other person may design two-dimensional layout 120 from drawings, specifications, or other suitable information about aircraft 102. In still another illustrative example, two-dimensional layout 120 may be embodied in another type of data structure other than webpage 162. For example, a web document with the universal resource identifier may be used.

As depicted in FIG. 5, up direction 518 or field-of-view 520 may be omitted from path 510 in link 506. In other illustrative examples, path 510 may also include a scaling factor for the three-dimensional view.

As a further example, in FIG. 1, three-dimensional view 128 and two-dimensional layout 120 may be displayed in graphical user interface 122 on display 124 on mobile device 112 on aircraft inspection system 108, even though a portion of two-dimensional layout 120 has not been selected. In this type of implementation, three-dimensional view 128 may be initially displayed as a default view, such as the outside of aircraft 102, a default location in interior 106 of aircraft 102, or some other preselected view.

In yet another example, a device other than inertial measurement unit 148 may be used to identify movement 144 of mobile device 112. For example, a camera on mobile device 112 may be used to detect when movement 144 occurs. In another illustrative example, input system 142 includes a touchscreen through which operator 110 or some other person may move a human digit on the touchscreen to generate user input 146 to change three-dimensional view 128. In other illustrative examples, input system 142 may include a mouse for a touchpad that operator 110 may manipulate to change direction 138 of three-dimensional view 128.

As another illustrative example, input system 142 may include a microphone through which operator 110 may change three-dimensional view 128 using voice commands. Any input device or a combination of input devices may be used to change three-dimensional view 128. In yet another illustrative example, inertial measurement unit 148 may be part of input system 142. Further, although inertial measurement unit 148 is shown as a separate component from input system 142 in FIG. 1, inertial measurement unit 148 may be considered part of input system 142 in which user input 146 is generated by inertial measurement unit 148 in response to operator 110 changing the orientation or otherwise moving mobile device 112 such that inertial measurement unit 148 detects movement 144.

Figure 6:
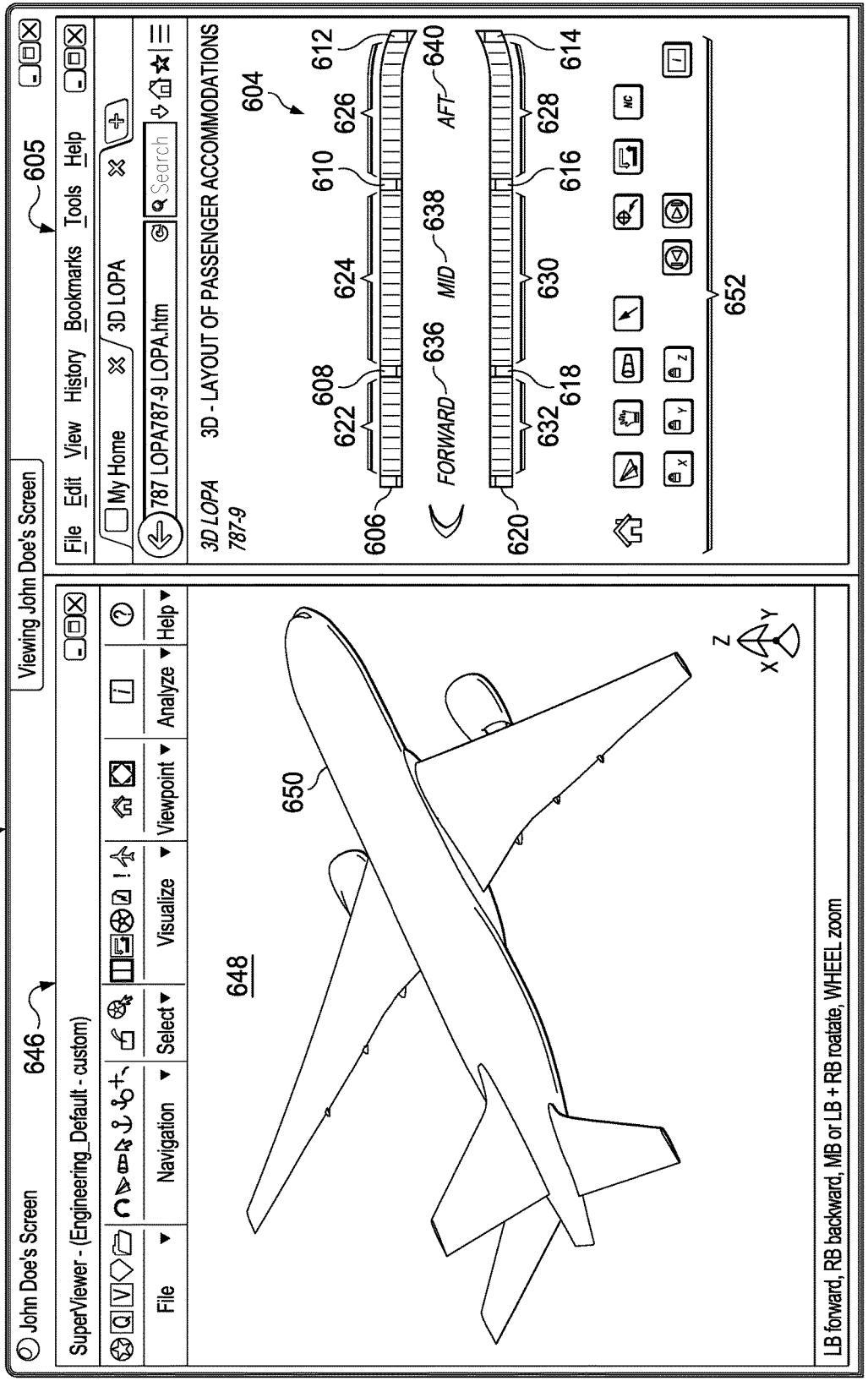
FIG. 6 is an illustration of a two-dimensional layer displayed in a graphical user interface on a display on a mobile device in accordance with an illustrative embodiment.

With reference next to FIG. 6, an illustration of a two-dimensional layer displayed in a graphical user interface on a display on a mobile device is depicted in accordance with an illustrative embodiment. In this illustrative example, display 600 is an example of an implementation for display 124 on mobile device 112 shown in block form in FIG. 1.

In this illustrative example, graphical user interface 602 is displayed on display 600. Graphical user interface 602 shows two-dimensional layout 604 of an interior of an aircraft in a first level of detail in window 605 in graphical user interface 602. Window 605 is a window for a browser in two-dimensional layout 604 from a webpage. Two-dimensional layout 604 is an example of an implementation for two-dimensional layout 120 as shown in block form in FIG. 1 and FIG. 3.

As depicted, two-dimensional layout 604 includes graphical elements in the form of fixed features. These fixed features include door 606, door 608, door 610, door 612, door 614, door 616, door 618, and door 620. Further, windows are fixed features as shown in section 622, section 624, section 626, section 628, section 630, and section 632 in two-dimensional layout 604.

Further, two-dimensional layout 604 also identifies areas within the interior of the aircraft. As depicted, these areas are forward 636, mid 638, and aft 640.

In this illustrative example, door 606, door 608, door 618, door 620, section 622, and section 632 are part of forward 636. As depicted, door 610, door 616, section 624, and section 630 are part of mid 638. Door 612, door 614, section 626, and section 628 are part of aft 640. Selection of one of these areas in two-dimensional layout 604 provides a second level of detail.

In this example, the browser may generate hypertext transfer protocol (HTTP) calls in response to a user input selecting a fixed feature in two-dimensional layout 604 displayed in window 605. These HTTP calls are processed by a view generator that may be located on the mobile device or in a remote location on another computer system.

The view generator returns images or other types of graphic information to a browser for display. As depicted, window 646 of graphical user interface 602 shows three-dimensional view 648 of aircraft 650. Window 646 is another window for a browser that receives and displays three-dimensional view 648. Three-dimensional view 648 is received as graphics data that is displayed by a browser directly or by a plugin for the browser in window 646.

Three-dimensional view 648 is an example of one implementation for three-dimensional view 128 shown in block form in FIG. 1. In this example, an exterior view of aircraft 650 is displayed in three-dimensional view 648 as an initial default view.

In this illustrative example, controls 652 are also displayed in graphical user interface 602. Controls 652 may be used to perform at least one of inputting commands or entering information. For example, controls 652 may be used to manipulate or control the display of at least one of two-dimensional layout 604 or three-dimensional view 648. In this illustrative example, controls 652 may have a size and configuration for human digits on display 600 when display 600 is a touchscreen for a device, such as a mobile phone or a tablet computer.

Figure 7:
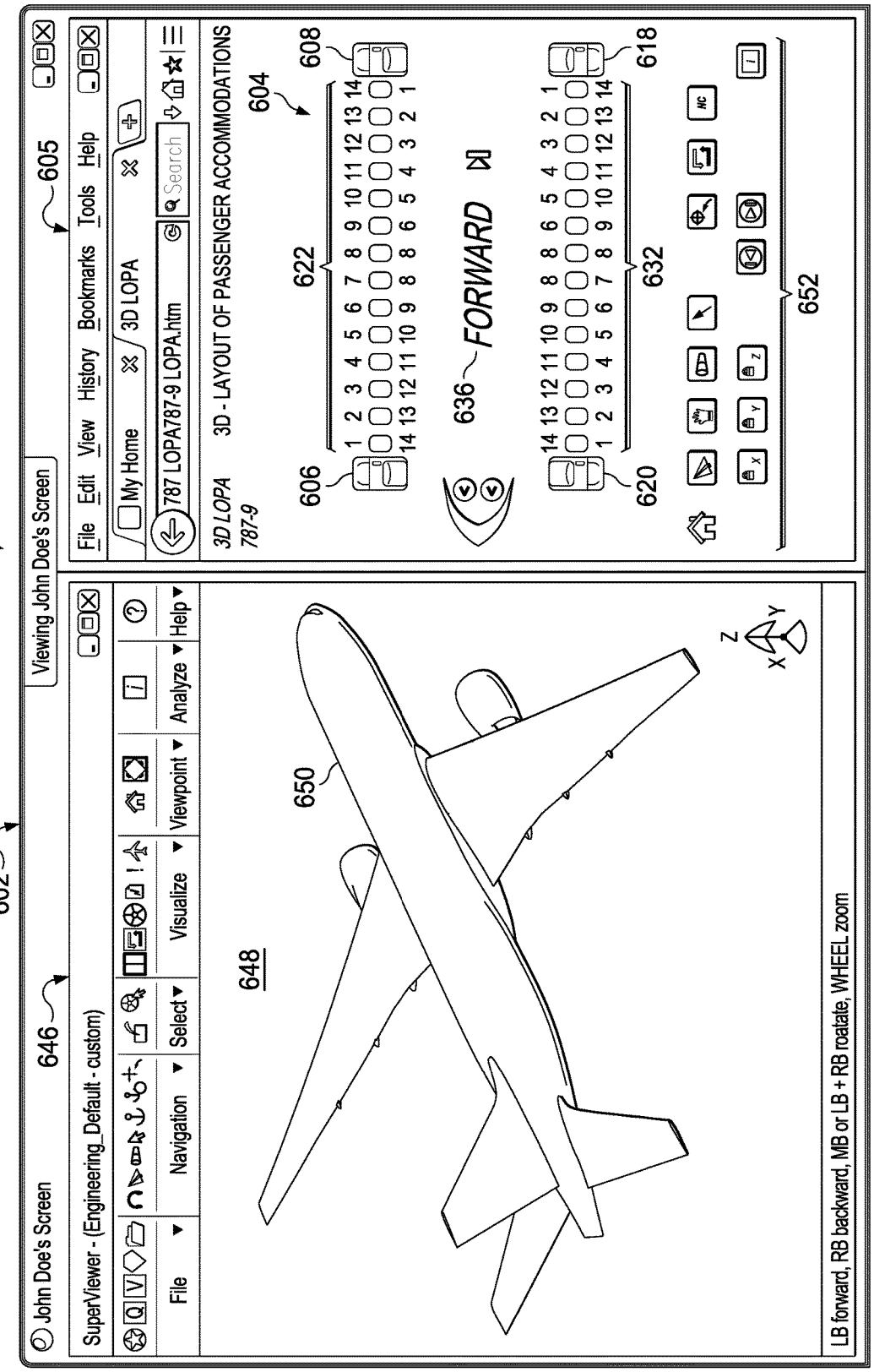
FIG. 7 is an illustration of a higher level of detail for a two-dimensional layout displayed on a display on a mobile device in accordance with an illustrative embodiment.

With reference now to FIG. 7, an illustration of a higher level of detail for a two-dimensional layout displayed on a display on a mobile device is depicted in accordance with an illustrative embodiment. In this illustrative example, display 600 changes in response to a selection of forward 636.

As depicted, window 605 in graphical user interface 602, in which two-dimensional layout 604 is displayed, changes to show an enlarged view of forward 636. This enlarged view provides a higher level of detail as compared to the level of detail illustrated in FIG. 6. Window 646 remains unchanged in this example. This enlarged view of forward 636 in two-dimensional layout 604, as displayed in window 605, allows an operator to more easily view and select different fixed features in forward 636.

An inspector in the interior of the aircraft may inspect a door and find an inconsistency, such as a smudge, while inspecting the aircraft for delivery to a customer. The inspector may select door 606 that corresponds to the door on which the inspector finds the smudge.

Figure 8:
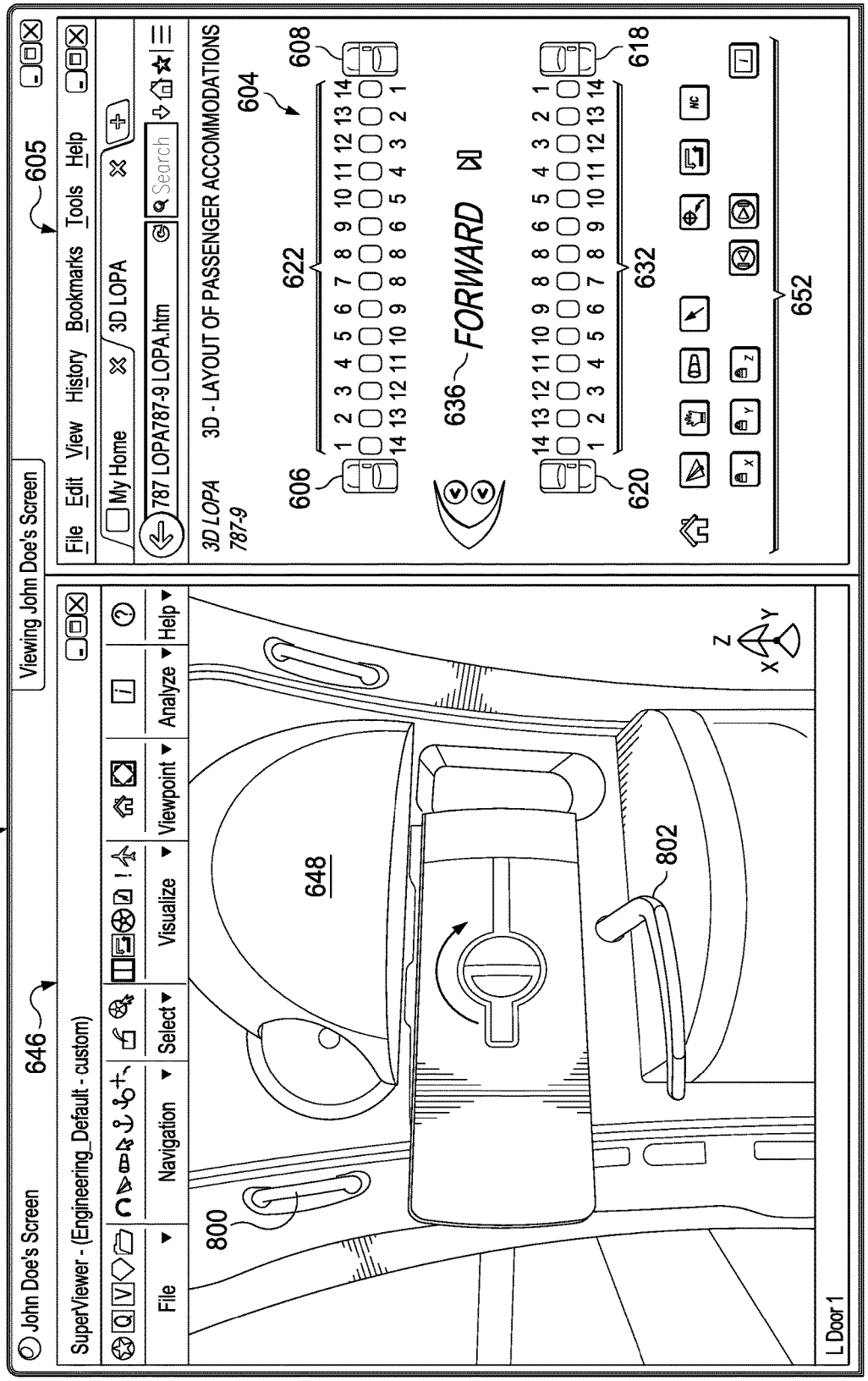
FIG. 8 is an illustration of a door in a three-dimensional view in accordance with an illustrative embodiment.

Turning to FIG. 8, an illustration of a door in a three-dimensional view is depicted in accordance with an illustrative embodiment. With the selection of door 606 in two-dimensional layout 604 in window 605, three-dimensional view 648 in window 646 changes to display door 800 in three-dimensional view 648. Door 800 is a three-dimensional representation of door 606 shown in two-dimensions as two-dimensional layout 604 in window 605.

In this manner, the inspector may select the portion of door 800 that has a smudge. As depicted, the smudge is located on handle 802 on door 800. The inspector may select handle 802 to enter information about an inconsistency.

Figure 9:
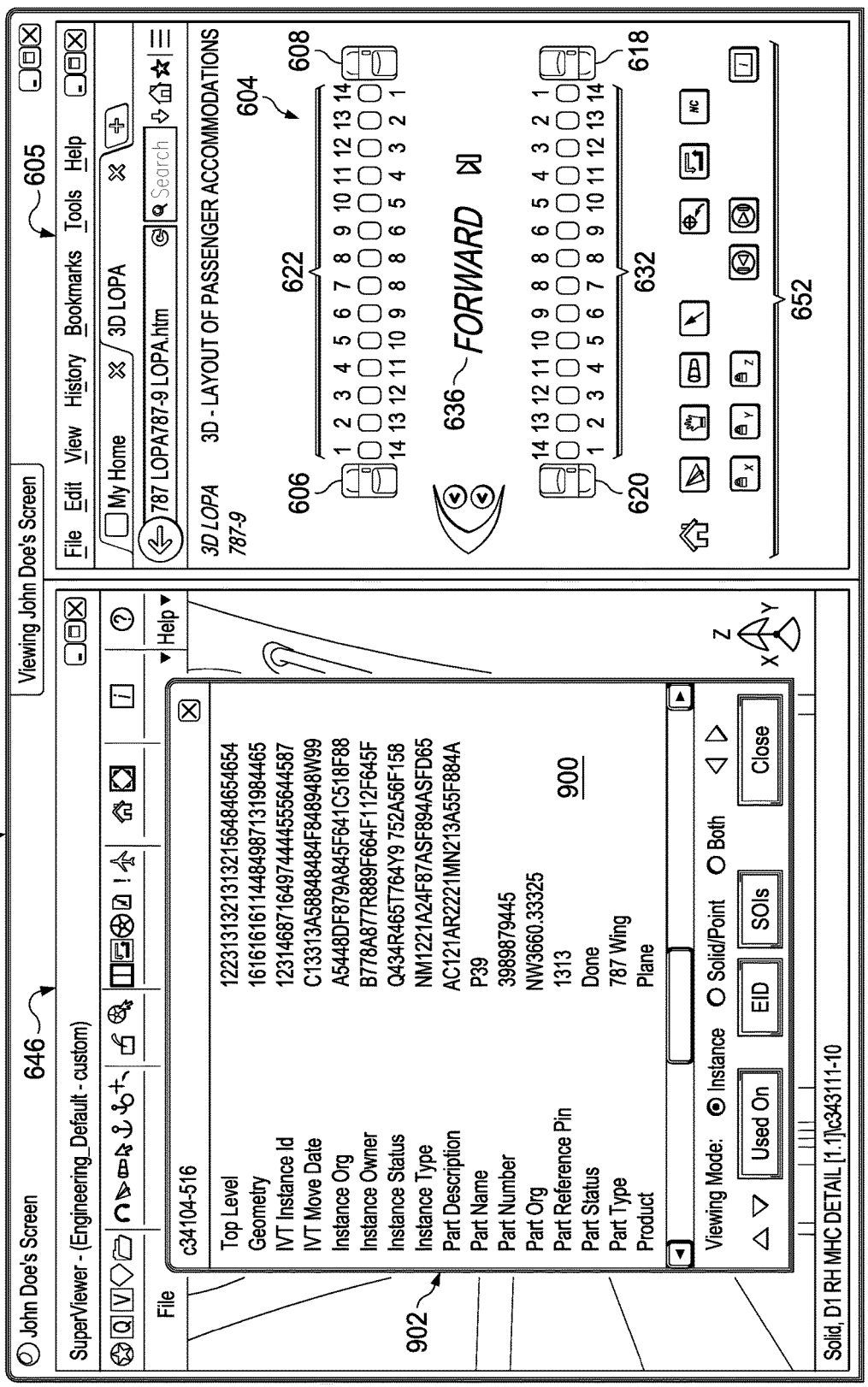
FIG. 9 is an illustration of a part identifier for a handle on a door in a three-dimensional view in accordance with an illustrative embodiment.

Turning to FIG. 9, an illustration of a part identifier for a handle on a door in a three-dimensional view is depicted in accordance with an illustrative embodiment. In this illustrative example, part information 900 for handle 802 in FIG. 8 is displayed in window 902.

Figure 10:
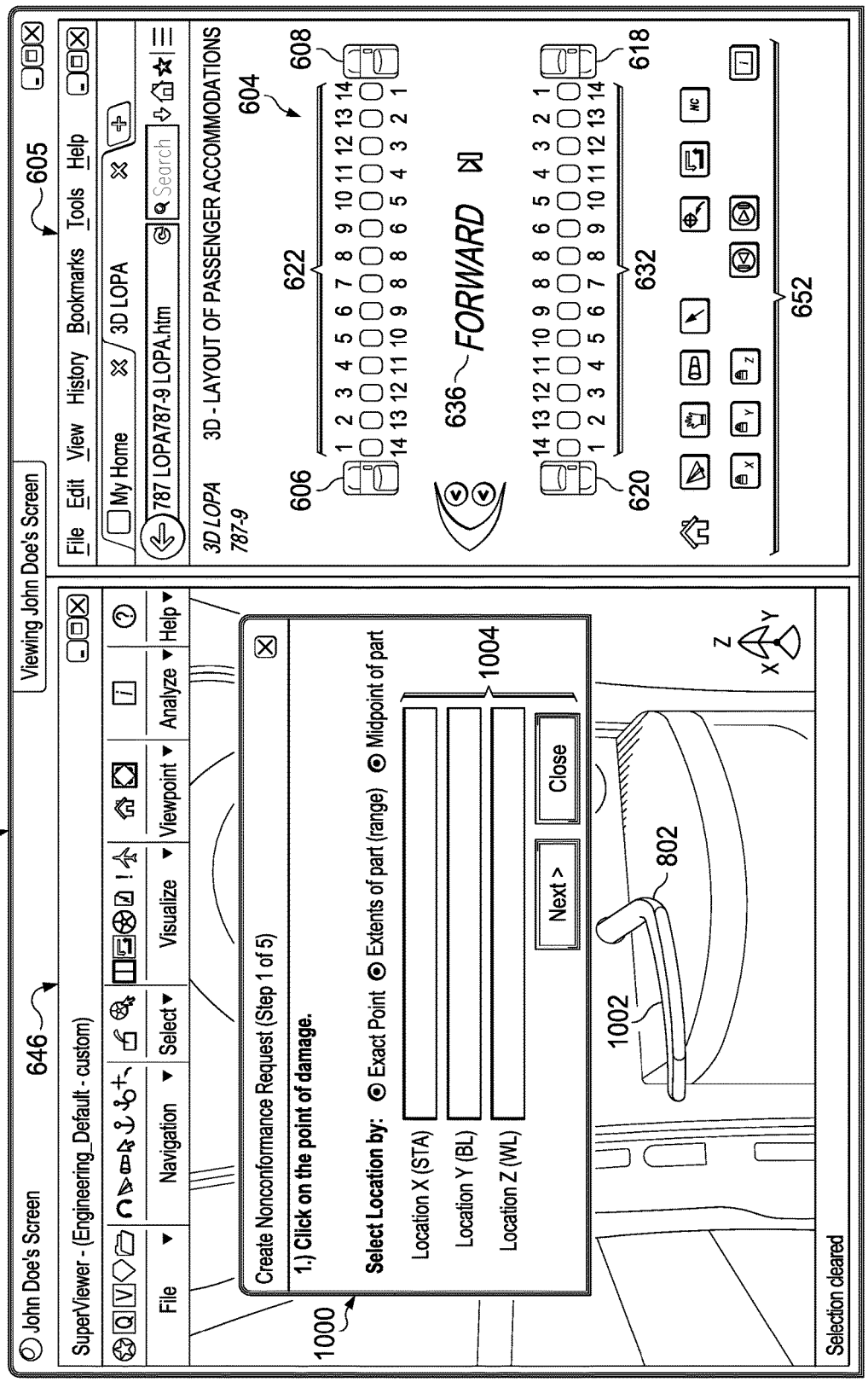
FIG. 10 is an illustration of an interface for entering information about an inconsistency for a part in accordance with an illustrative embodiment.

With reference now to FIG. 10, an illustration of an interface for entering information about an inconsistency for a part is depicted in accordance with an illustrative embodiment. As depicted, window 1000 is displayed in which a location of an inconsistency can be identified. An inspector selects the location on handle 802 through an input device, such as a touch screen, a mouse, a trackball, or some other user input device. Selection of location 1002 on handle 802 results in coordinates for location 1002 being entered into coordinate fields 1004 in window 1000.

Figure 11:
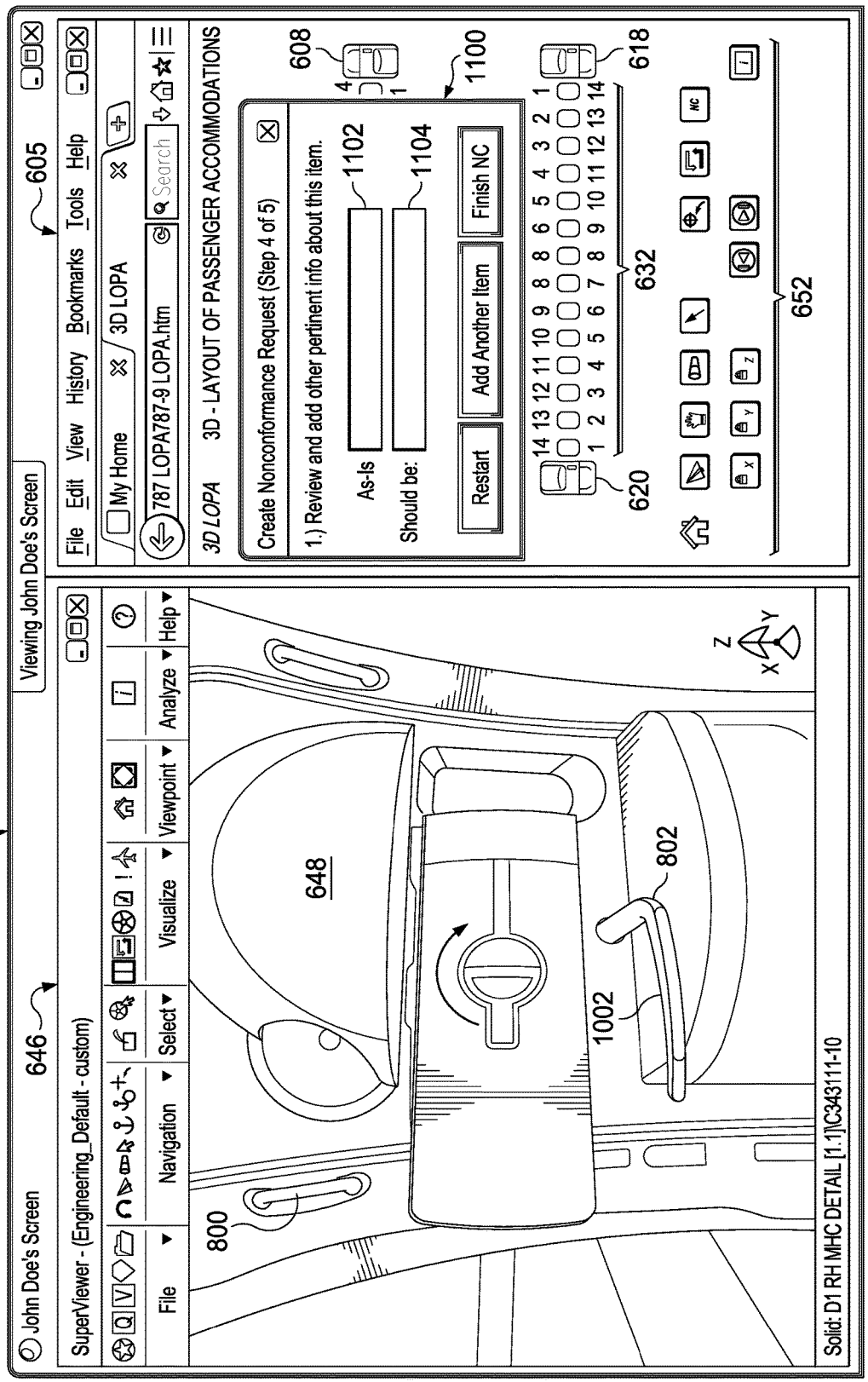
FIG. 11 is an illustration of an interface for entering information about an inconsistency for a part in accordance with an illustrative embodiment.

In FIG. 11, an illustration of an interface for entering information about an inconsistency for a part is depicted in accordance with an illustrative embodiment. In this example, window 1100 is displayed and configured to receive information about the inconsistency. The information about the inconsistency is entered into field 1102. The information about what the condition should be for the part is entered into field 1104.

Figure 12:
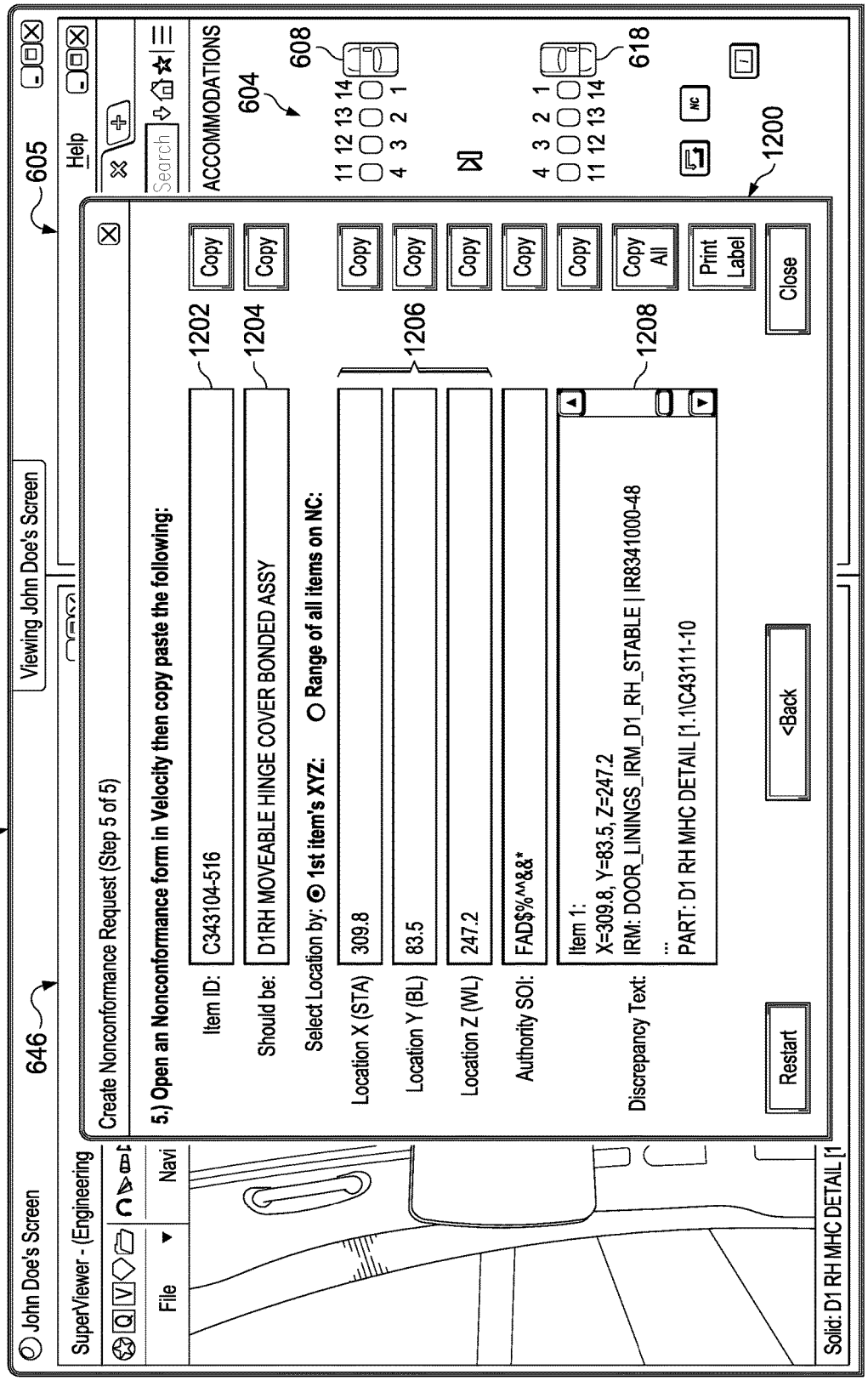
FIG. 12 is an illustration of an inconsistency report in accordance with an illustrative embodiment.

Turning to FIG. 12, an illustration of an inconsistency report is depicted in accordance with an illustrative embodiment. In this example, window 1200 shows information that will be submitted for an inconsistency. As depicted, window 1200 shows part identifier 1202, part name 1204, coordinates 1206, and description 1208.

As depicted, the location of a part may be identified with coordinates during an inspection, such as a customer walk-through. As depicted, other information, such as a part number, a description of the inconsistency, and other information, also may be recorded during the walk-through. This process also may be performed to identify maintenance issues after the aircraft has been delivered and is in service.

Figure 13:
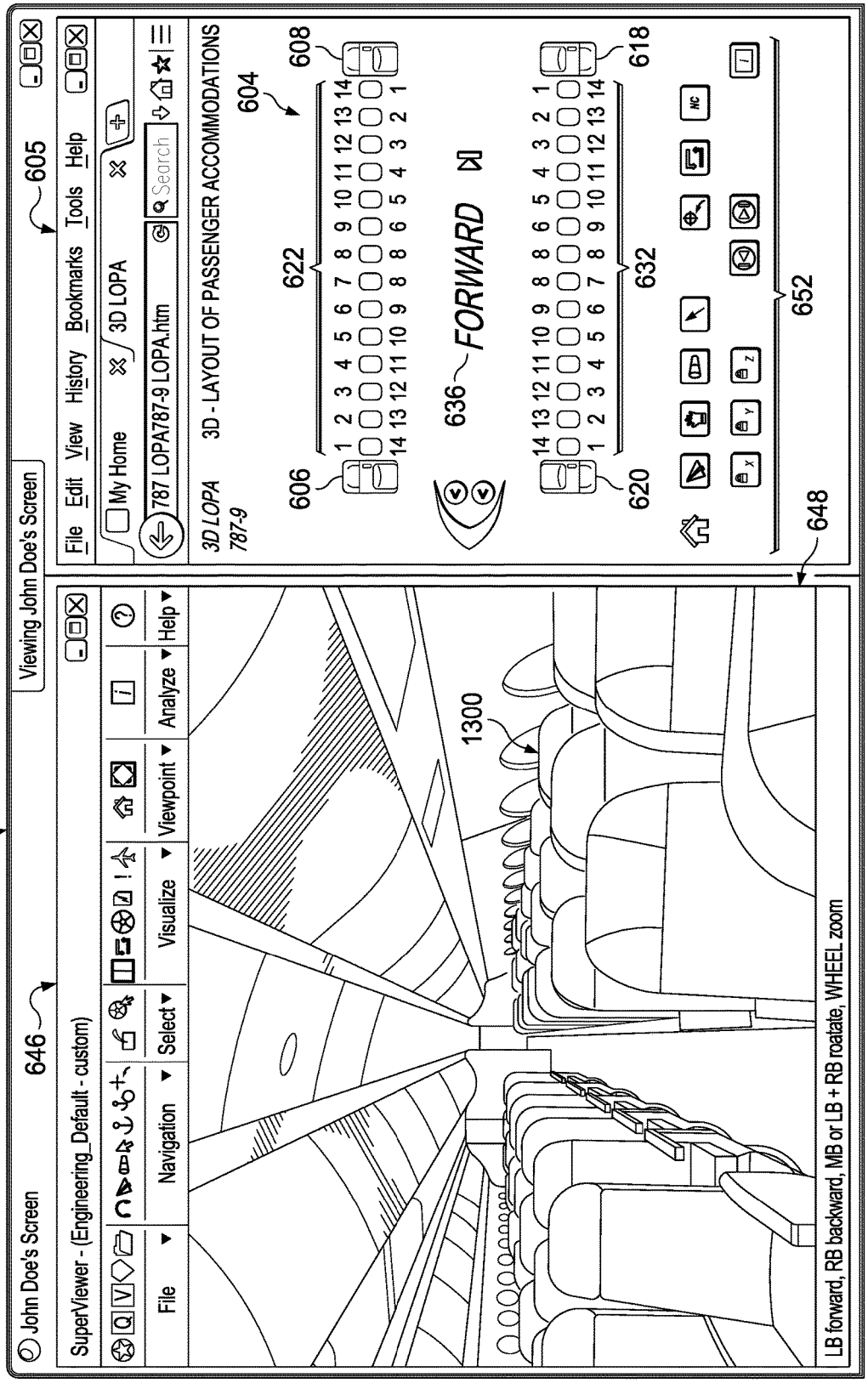
FIG. 13 is an illustration of a three-dimensional view displayed on a display on a mobile device in accordance with an illustrative embodiment.

Next in FIG. 13, an illustration of a three-dimensional view displayed on a display on a mobile device is depicted in accordance with an illustrative embodiment. In this figure, three-dimensional view 648 changes direction from the same viewpoint. With this change in direction, seats 1300 are seen in three-dimensional view 648.

The change in direction is a rotation about the viewpoint in this illustrative example and may change through a user input. User input may be a human digit moving on a touchscreen, a change in orientation of a mobile device caused by an operator of the mobile device and detected by an inertial measurement unit, or some other type of user input.

Figure 14:
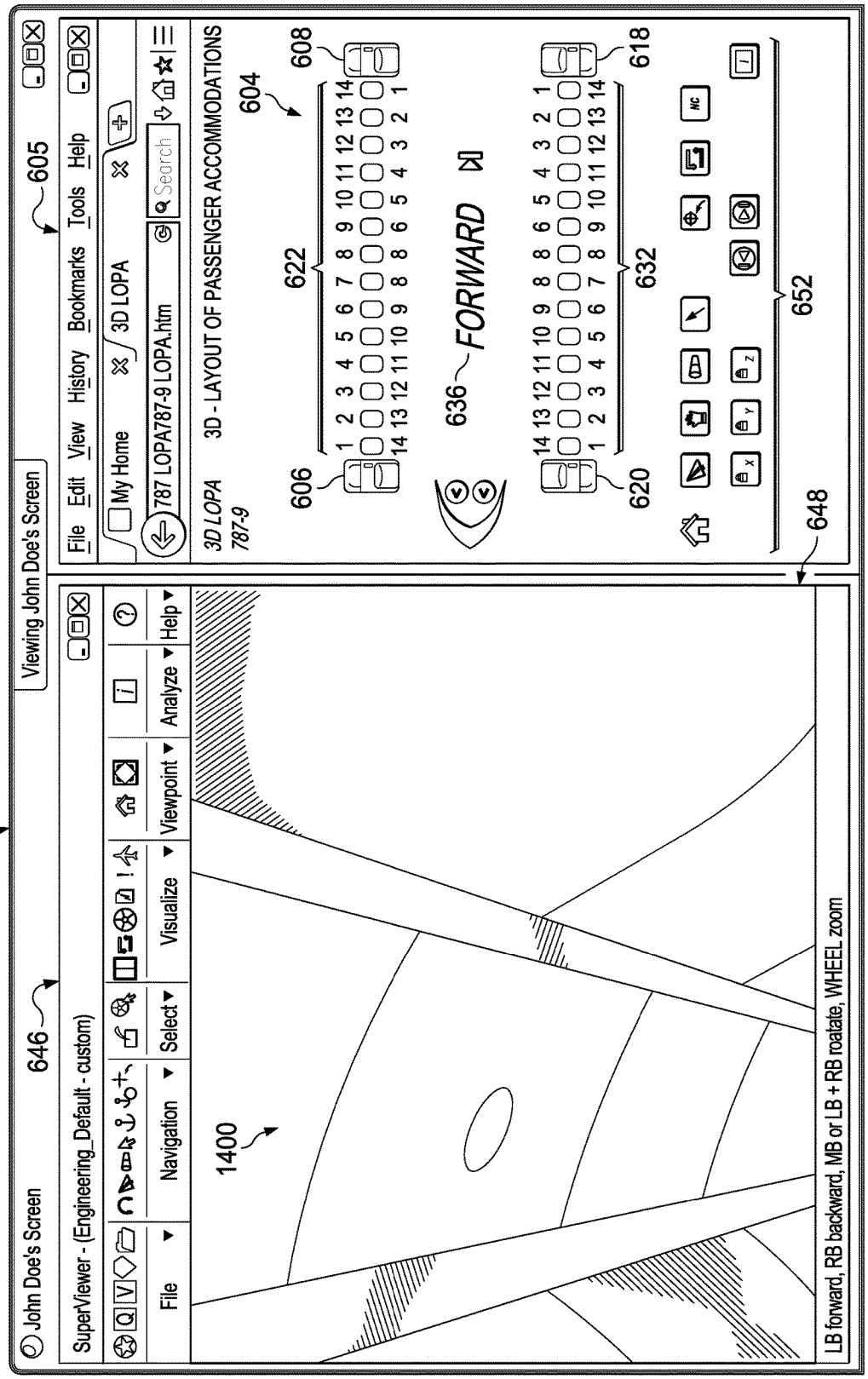
FIG. 14 is another illustration of a three-dimensional view displayed on a display on a mobile device in accordance with an illustrative embodiment.

Turning now to FIG. 14, another illustration of a three-dimensional view displayed on a display on a mobile device is depicted in accordance with an illustrative embodiment. The direction of three-dimensional view 648 is rotated with the same view to show ceiling 1400 of the aircraft.

The illustrations of display 600 with graphical user interface 602 in FIGS. 6-14 are provided as examples of one manner in which graphical user interface 122 with display 124 shown in block form in FIG. 1 may be displayed. These examples are not meant to limit the manner in which graphical user interface 122 with display 124 may be implemented. For example, window 605 with two-dimensional layout 604 may be removed when three-dimensional view 648 is displayed in window 646. As another example, three-dimensional view 648 also may allow translation in one or more axes in addition to allowing the direction to rotate.

Figure 15:
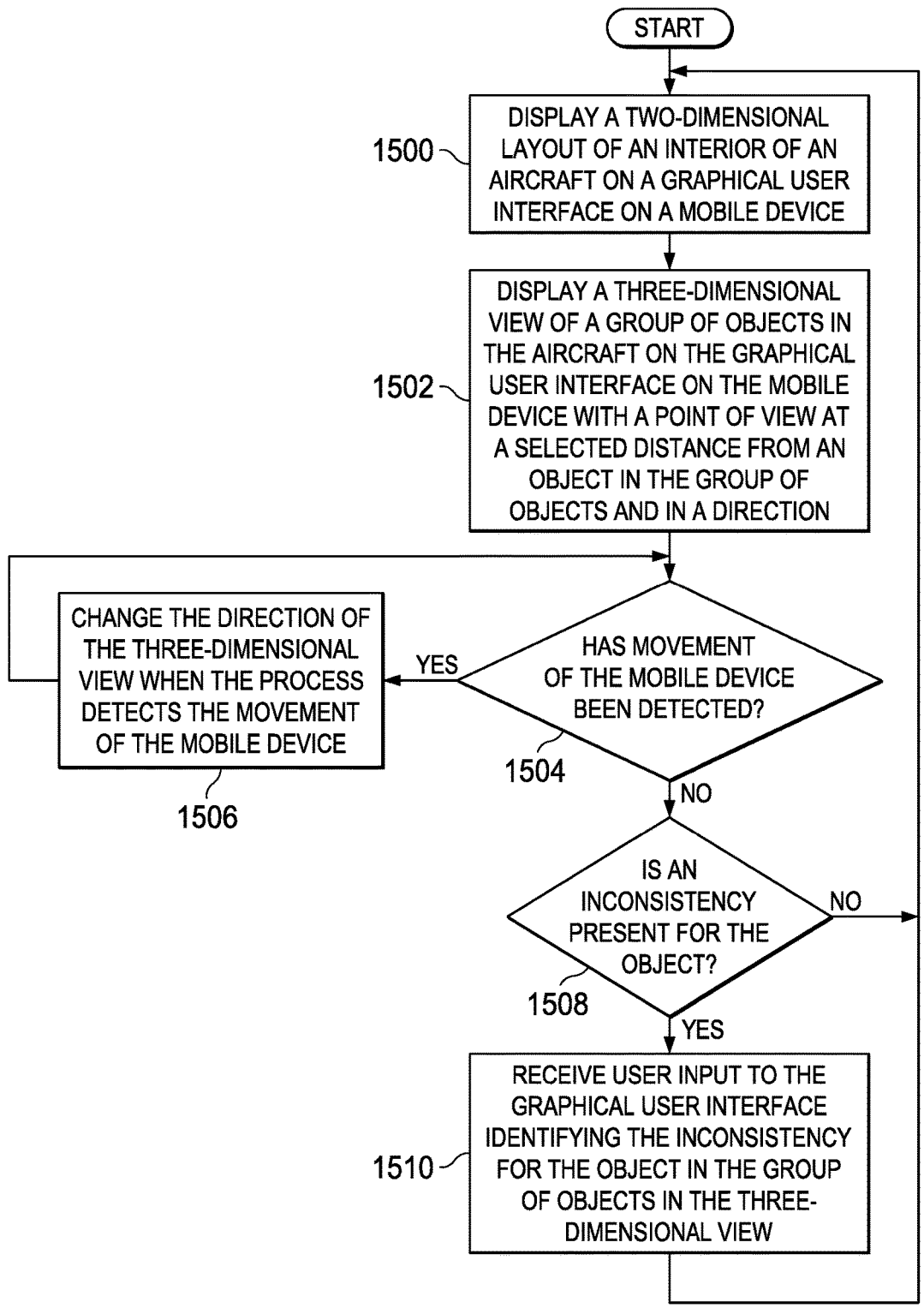
FIG. 15 is an illustration of a flowchart of a process for inspecting an aircraft in accordance with an illustrative embodiment.

Turning next to FIG. 15, a flowchart of a process for inspecting an aircraft is depicted in accordance with an illustrative embodiment. The process in FIG. 15 is implemented in a data processing system, such as mobile device 112 in FIG. 1.

The process begins by displaying a two-dimensional layout of an interior of an aircraft on a graphical user interface on a mobile device (operation 1500). In operation 1500, the two-dimensional layout includes a group of fixed features visible within the interior of the aircraft.

The process displays a three-dimensional view of a group of objects in the aircraft on the graphical user interface on the mobile device with a point-of-view at a selected distance from an object in the group of objects and in a direction (operation 1502). Displaying the three-dimensional view in operation 1502 is performed when a fixed feature corresponding to the object is selected from the group of fixed features in the two-dimensional layout using an input system for the mobile device. The objects may include one or more of the fixed features displayed in the two-dimensional layout, including the fixed feature that is selected from the two-dimensional layout. These objects include, for example, a door, a window, a row of seats, a stowage bin, a wall, a light, a sign, a closet, or some other object that may be present in the interior of the aircraft.

A determination is made as to whether movement of the mobile device has been detected (operation 1504). The movement of the mobile device may be detected using an inertial measurement unit for the mobile device. In this example, the movement is a change in orientation of the mobile device, but also may include linear movement in a particular direction.

When the movement of the mobile device is detected, the process changes the direction of the three-dimensional view when the process detects the movement of the mobile device (operation 1506). In operation 1506, the data about the movement of the mobile device is sent to a computer system that includes a view generator that generates the three-dimensional view displayed by the mobile device. The process then returns to operation 1504.

With reference again to operation 1504, if movement of the device has not been detected, a determination is made as to whether an inconsistency is present for the object (operation 1508). The determination in operation 1508 may be made in response to a user input indicating that an inconsistency is present. If an inconsistency is present for the object, the process receives user input to the graphical user interface identifying the inconsistency for the object in the group of objects in the three-dimensional view (operation 1510). The process then returns to operation of 1500. The process also returns to operation 1500 from operation 1508 if an inconsistency is not present in operation 1508.

Figure 16:
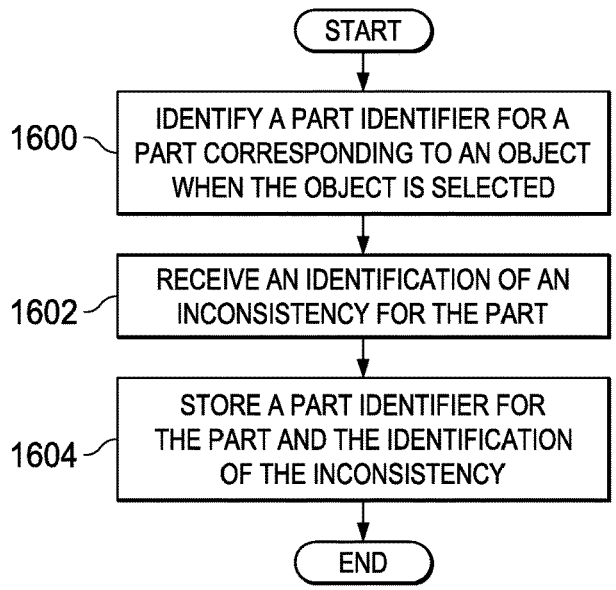
FIG. 16 is an illustration of a flowchart of a process entering an inconsistency using a mobile device in accordance with an illustrative embodiment.

With reference next to FIG. 16, an illustration of a flowchart of a process entering an inconsistency using a mobile device is depicted in accordance with an illustrative embodiment. The process illustrated in FIG. 16 is an example of an implementation for operation 1510 in FIG. 15.

The process begins by identifying a part identifier for a part corresponding to an object when the object is selected (operation 1600). The part identifier may be a part number, a serial number, or some other suitable identifier obtained from a view generator that generates a three-dimensional view of the object.

The process then receives an identification of an inconsistency for the part (operation 1602). The identification of the inconsistency is selected from at least one of coordinates of a location of the inconsistency on the part, a description of the inconsistency, or some other suitable information that may relate to the inconsistency.

The process stores a part identifier for the part and the identification of the inconsistency (operation 1604) with the process terminating thereafter. This information may be used to generate work orders to remove or reduce the inconsistencies. For example, the part identifier for the part and the identification of the inconsistency may be stored as an entry in a rework list for the aircraft.

Figure 17:
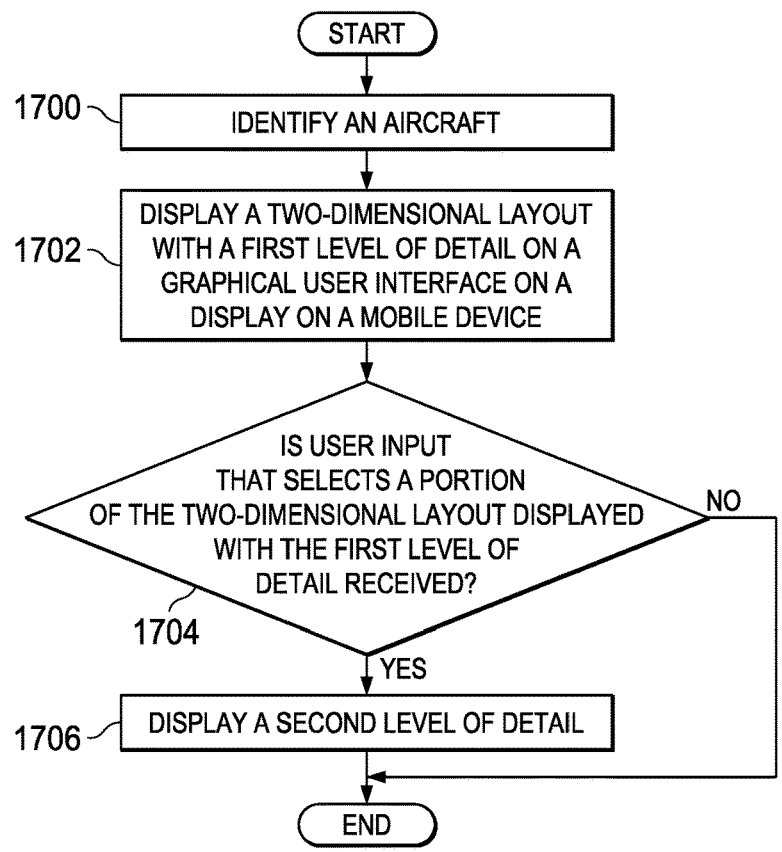
FIG. 17 is an illustration of a flowchart of a process for displaying a two-dimensional layout on a display on a mobile device in accordance with an illustrative embodiment.

With reference now to FIG. 17, an illustration of a flowchart of a process for displaying a two-dimensional layout on a display of a mobile device is depicted in accordance with an illustrative embodiment. The process illustrated in this flowchart is an example in one manner of how a two-dimensional layout of the interior of an aircraft may be displayed with different levels of detail.

The process begins by identifying an aircraft (operation 1700). The aircraft may be identified by at least one of a model number, a customer number, or some other suitable information. User input may be received that selects the aircraft from a list of aircraft. The identification includes identifying a web document, such as a webpage that contains information used to display a two-dimensional layout.

The process displays a two-dimensional layout with a first level of detail on a graphical user interface on a display on a mobile device (operation 1702). A determination is made as to whether user input that selects a portion of the two-dimensional layout displayed with the first level of detail is received (operation 1704). The first level of detail shows less information such that all of the interior or a desired amount of the interior of the aircraft can be displayed on the mobile device. The portion may be, for example, an area in the first level of detail, such as forward, mid, aft, crew quarters, flight deck, or some other area displayed in the two-dimensional layout with the first level of detail.

If the user input that selects a portion of the two-dimensional layout displayed in the first level of detail is received, the process displays a second level of detail (operation 1706). The second level of detail is an enlarged view of the portion selected from the two-dimensional layout in the first level of detail.

For example, selecting an aft area in the two-dimensional layout display in the first level of detail results in the aft area being displayed in a second level of detail. The second level of detail may merely be an enlarged view of the aft area, thus allowing easier viewing of the different features in the aft area. In other illustrative examples, additional information may be displayed in the second level of detail not shown in the first level of detail. For example, numbering of features, additional features, or other information may be displayed in the second level of detail. Turning back to operation 1704, if user input is not received, the process terminates.

Figure 18:
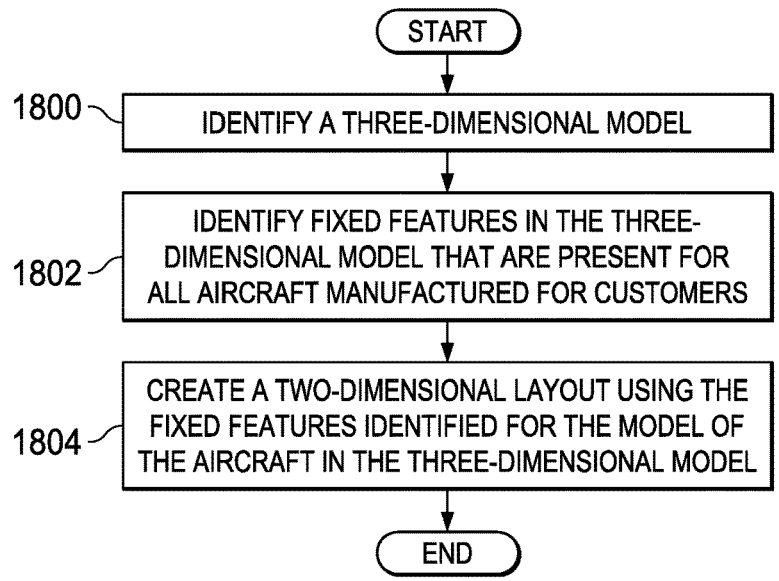
FIG. 18 is an illustration of a flowchart of a process for creating a two-dimensional layout of an interior of an aircraft for a particular model of the aircraft in accordance with an illustrative embodiment.

With reference next to FIG. 18, an illustration of a flowchart of a process for creating a two-dimensional layout of an interior of an aircraft for a particular model of the aircraft is depicted in accordance with an illustrative embodiment. The different operations in this flowchart may be implemented in view generator 150 shown in block form in FIG. 1.

The process begins by identifying a three-dimensional model (operation 1800). The three-dimensional model is for a particular model of aircraft. The process identifies fixed features in the three-dimensional model that are present for all aircraft manufactured for customers (operation 1802). In this example, the fixed features are features that do not vary for the particular model of the aircraft. In other words, the customer cannot request that a particular feature in the fixed features be removed or changed.

The process creates a two-dimensional layout using the fixed features identified for the model of the aircraft in the three-dimensional model (operation 1804) with the process terminating thereafter. The two-dimensional layout may be located in one or more webpages. For example, if multiple levels of detail are present for the two-dimensional layout, each of these levels of detail may be in a separate webpage. In other illustrative examples, all of the levels of detail may be present in a single webpage.

Figure 19:
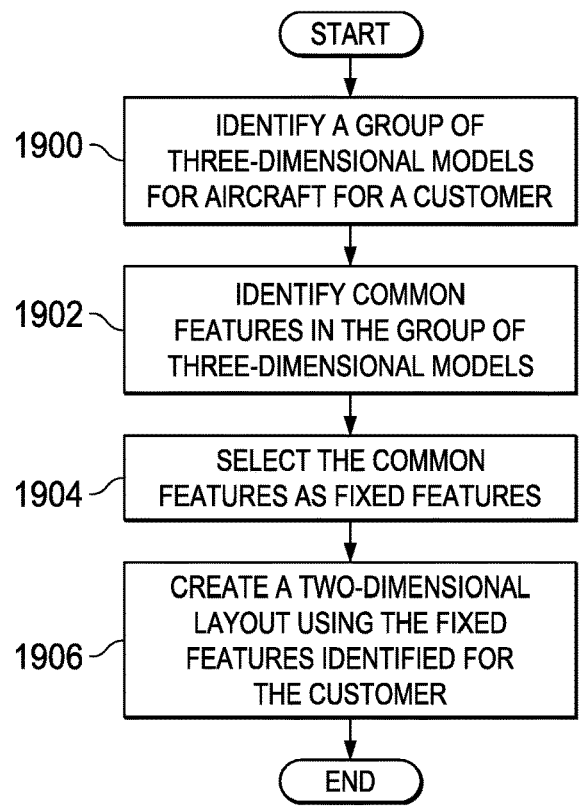
FIG. 19 is an illustration of a flowchart of a process for creating a two-dimensional layout of an interior of an aircraft for a customer in accordance with an illustrative embodiment.

With reference now to FIG. 19, an illustration of a flowchart of a process for creating a two-dimensional layout of an interior of an aircraft for a customer is depicted in accordance with an illustrative embodiment. The operations illustrated in this flowchart may be implemented in view generator 150 shown in block form in FIG. 1.

The process begins by identifying a group of three-dimensional models for aircraft for a customer (operation 1900). In this example, a three-dimensional model is present for each aircraft ordered by the customer that has different options from other aircraft ordered by the customer. For example, five aircraft for a particular model of the aircraft with the same options may be represented by a first three-dimensional model. Six aircraft are of the same model in which the six aircraft have the same options but different options from the five aircraft. These six aircraft may be represented by a second three-dimensional model.

The process identifies common features in the group of three-dimensional models (operation 1902). The common features are features that are found in all of the models in the group of three-dimensional models.

The process selects the common features as fixed features (operation 1904). The process then creates a two-dimensional layout using the fixed features identified for the customer (operation 1906) with the process terminating thereafter. Thus, a two-dimensional layout may be generated for each customer to further customize the purchasing experience of aircraft from a manufacturer.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware.

Each block in the flowcharts or the block diagrams may be implemented using special purpose hardware systems that perform the different operations or combinations of special purpose hardware and program code run by the special purpose hardware. For example, the different operations illustrated the flowcharts may be implemented as software that run by a processor unit in data processing system, such as a mobile device, a computer system, or some other suitable type of data processing system.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, in addition to changing the direction of the three-dimensional view in the flowchart in FIG. 15, the process may also may also change the viewpoint. As another example, the flowchart in FIG. 15 may also include one or more operations that allow the user to return to the display of the two-dimensional layout in response to user input.

As another example, the process in FIG. 17 shows operations for displaying a two-dimensional layout with two levels of detail. In other illustrative examples, one or more levels of detail, in addition to the two levels of detail, may be displayed. For example, a third level of detail may be displayed when a group of fixed features is selected.

Figure 20:
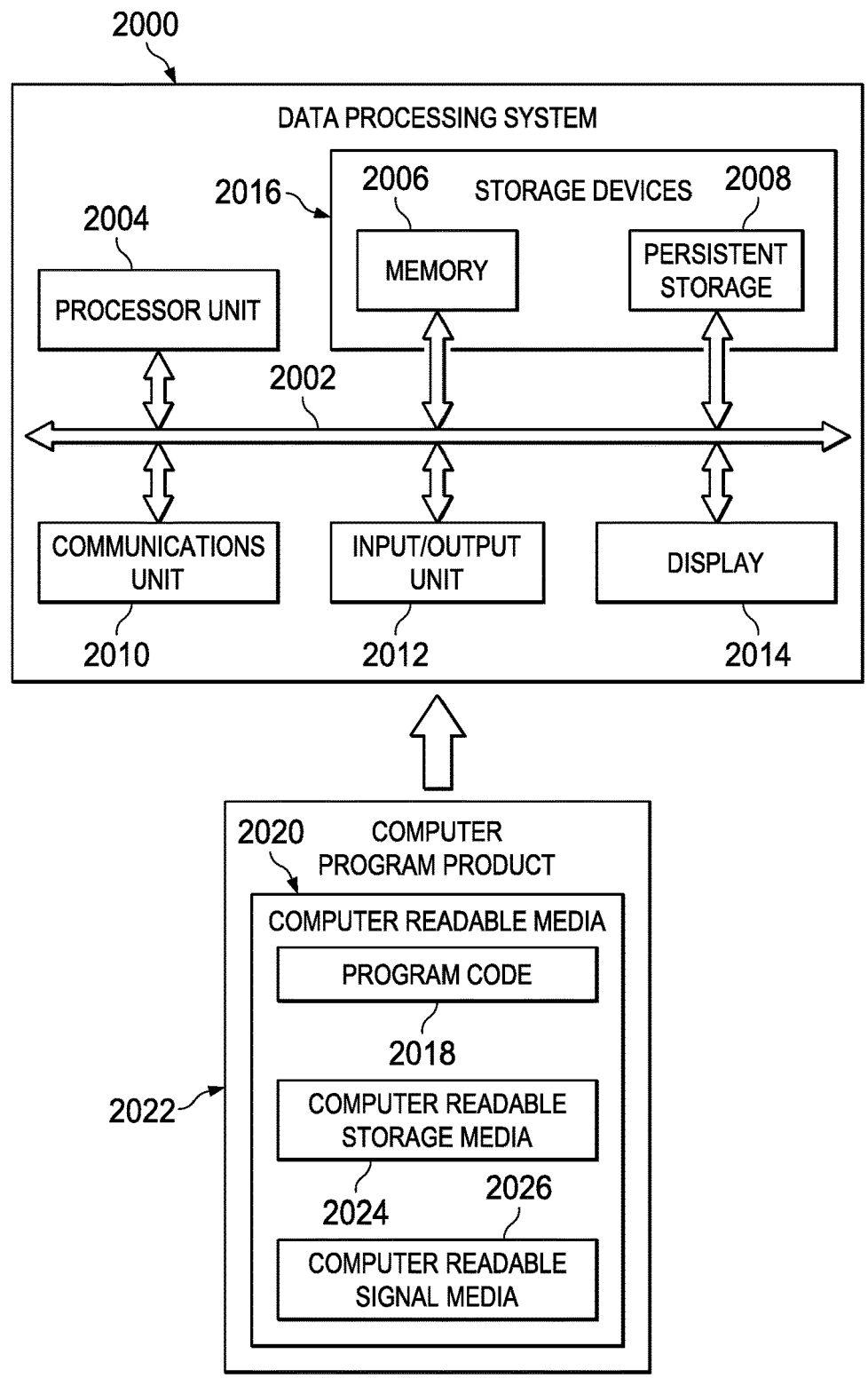
FIG. 20 is an illustration of a block diagram of a data processing system in accordance with an illustrative embodiment.

Turning now to FIG. 20, an illustration of a block diagram of a data processing system is depicted in accordance with an illustrative embodiment. Data processing system 2000 may be used to implement mobile device 112 and computer system 152 in FIG. 1. Data processing system 2000 also may be used to implement computer system 302 in FIG. 3.

In this illustrative example, data processing system 2000 includes communications framework 2002, which provides communications between processor unit 2004, memory 2006, persistent storage 2008, communications unit 2010, input/output (I/O) unit 2012, and display 2014. In this example, communications framework 2002 may take the form of a bus system.

Processor unit 2004 serves to execute instructions for software that may be loaded into memory 2006. Processor unit 2004 may be a number of processors, a multi-processor core, or some other type of processor, depending on the particular implementation.

Memory 2006 and persistent storage 2008 are examples of storage devices 2016. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 2016 may also be referred to as computer readable storage devices in these illustrative examples. Memory 2006, in these examples, may be, for example, a random access memory or any other suitable volatile or non-volatile storage device. Persistent storage 2008 may take various forms, depending on the particular implementation.

For example, persistent storage 2008 may contain one or more components or devices. For example, persistent storage 2008 may be a hard drive, a solid state hard drive, a flash memory, a rewritable optical disk, a rewritable magnetic tape, or some combination of the above. The media used by persistent storage 2008 also may be removable. For example, a removable hard drive may be used for persistent storage 2008.

Communications unit 2010, in these illustrative examples, provides for communications with other data processing systems or devices. In these illustrative examples, communications unit 2010 is a network interface card.

Input/output unit 2012 allows for input and output of data with other devices that may be connected to data processing system 2000. For example, input/output unit 2012 may provide a connection for user input through at least one of a keyboard, a mouse, or some other suitable input device. Further, input/output unit 2012 may send output to a printer. Display 2014 provides a mechanism to display information to a user.

Instructions for at least one of the operating system, applications, or programs may be located in storage devices 2016, which are in communication with processor unit 2004 through communications framework 2002. The processes of the different embodiments may be performed by processor unit 2004 using computer-implemented instructions, which may be located in a memory, such as memory 2006.

These instructions are referred to as program code, computer usable program code, or computer readable program code that may be read and executed by a processor in processor unit 2004. The program code in the different embodiments may be embodied on different physical or computer readable storage media, such as memory 2006 or persistent storage 2008.

Program code 2018 is located in a functional form on computer readable media 2020 that is selectively removable and may be loaded onto or transferred to data processing system 2000 for execution by processor unit 2004. Program code 2018 and computer readable media 2020 form computer program product 2022 in these illustrative examples. In one example, computer readable media 2020 may be computer readable storage media 2024 or computer readable signal media 2026.

In these illustrative examples, computer readable storage media 2024 is a physical or tangible storage device used to store program code 2018 rather than a medium that propagates or transmits program code 2018. Alternatively, program code 2018 may be transferred to data processing system 2000 using computer readable signal media 2026. Computer readable signal media 2026 may be, for example, a propagated data signal containing program code 2018. For example, computer readable signal media 2026 may be at least one of an electromagnetic signal, an optical signal, or any other suitable type of signal. These signals may be transmitted over at least one of communications links, such as wireless communications links, optical fiber cable, coaxial cable, a wire, or any other suitable type of communications link.

The different components illustrated for data processing system 2000 are not meant to provide architectural limitations to the manner in which different embodiments may be implemented. The different illustrative embodiments may be implemented in a data processing system including components in addition to or in place of those illustrated for data processing system 2000. Other components shown in FIG. 20 can be varied from the illustrative examples shown. The different embodiments may be implemented using any hardware device or system capable of running program code 2018.

Figure 21:
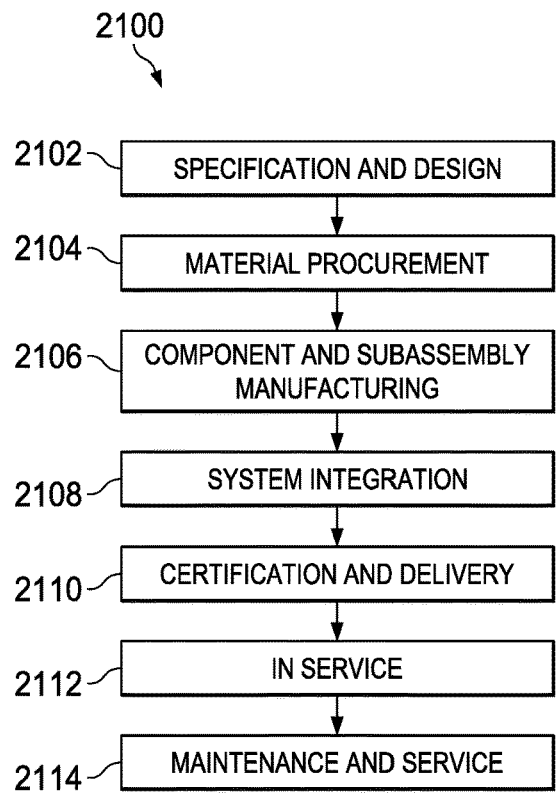
FIG. 21 is an illustration of a block diagram of an aircraft manufacturing and service method in accordance with an illustrative embodiment.
Figure 22:
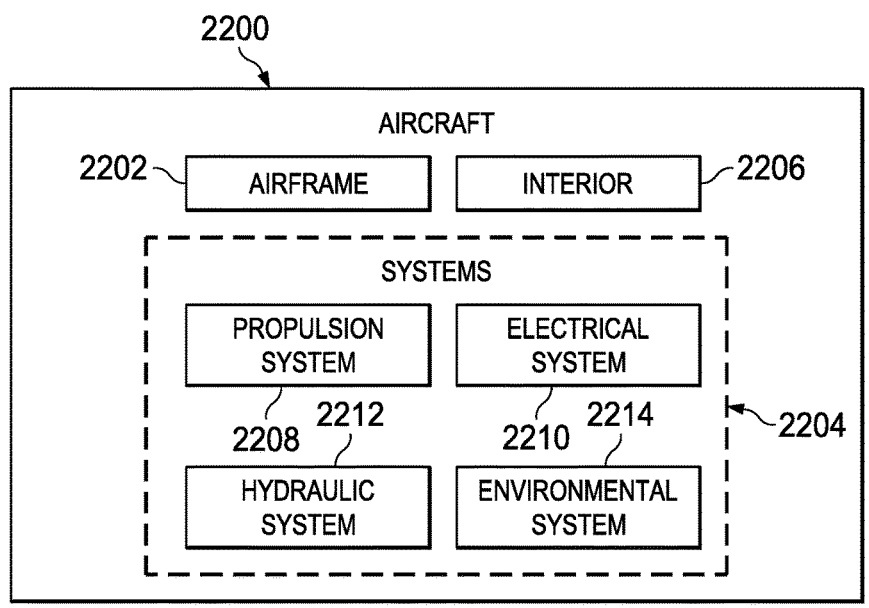
FIG. 22 is an illustration of a block diagram of an aircraft in which an illustrative embodiment may be implemented.

The illustrative embodiments of the present disclosure may be described in the context of aircraft manufacturing and service method 2100 as shown in FIG. 21 and aircraft 2200 as shown in FIG. 22. Turning first to FIG. 21, an illustration of a block diagram of an aircraft manufacturing and service method is depicted in accordance with an illustrative embodiment. During pre-production, aircraft manufacturing and service method 2100 may include specification and design 2102 of aircraft 2200 in FIG. 22 and material procurement 2104.

During production, component and subassembly manufacturing 2106 and system integration 2108 of aircraft 2200 takes place. Thereafter, aircraft 2200 may go through certification and delivery 2110 in order to be placed in service 2112. While in service 2112 by a customer, aircraft 2200 is scheduled for routine maintenance and service 2114, which may include modification, reconfiguration, refurbishment, and other maintenance or service.

Each of the processes of aircraft manufacturing and service method 2100 may be performed or carried out by a system integrator, a third party, an operator, or some combination thereof. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 22, an illustration of a block diagram of an aircraft is depicted in which an illustrative embodiment may be implemented. In this example, aircraft 2200 is produced by aircraft manufacturing and service method 2100 in FIG. 21 and may include airframe 2202 with plurality of systems 2204 and interior 2206. Examples of systems 2204 include one or more of propulsion system 2208, electrical system 2210, hydraulic system 2212, and environmental system 2214. Any number of other systems may be included. Although an aerospace example is shown, different illustrative embodiments may be applied to other industries, such as the automotive industry.

The apparatuses and methods embodied herein may be employed during at least one of the stages of aircraft manufacturing and service method 2100 in FIG. 21. For example, one or more apparatus embodiments, method embodiments, or a combination thereof may be certification and delivery 2110 in FIG. 21. One or more apparatus embodiments, method embodiments, or a combination thereof may be utilized while aircraft 2200 is in service 2112, during maintenance and service 2114 in FIG. 21, or both. For example, aircraft inspection system 108 in FIG. 1 may be used to perform inspections to prepare aircraft 2200 for delivery to the customer. Aircraft inspection system 108 may be used during maintenance and service 2114 to identify inconsistencies that may need maintenance. For example, aircraft inspection system 108 may be used to identify lights that may need replacement, a seat that may need cleanup, or some other inconsistency that may need a work order to remedy.

The use of a number of the different illustrative embodiments may substantially expedite the assembly of aircraft 2200, reduce the cost of aircraft 2200, or both expedite the assembly of aircraft 2200 and reduce the cost of aircraft 2200.

Figure 23:
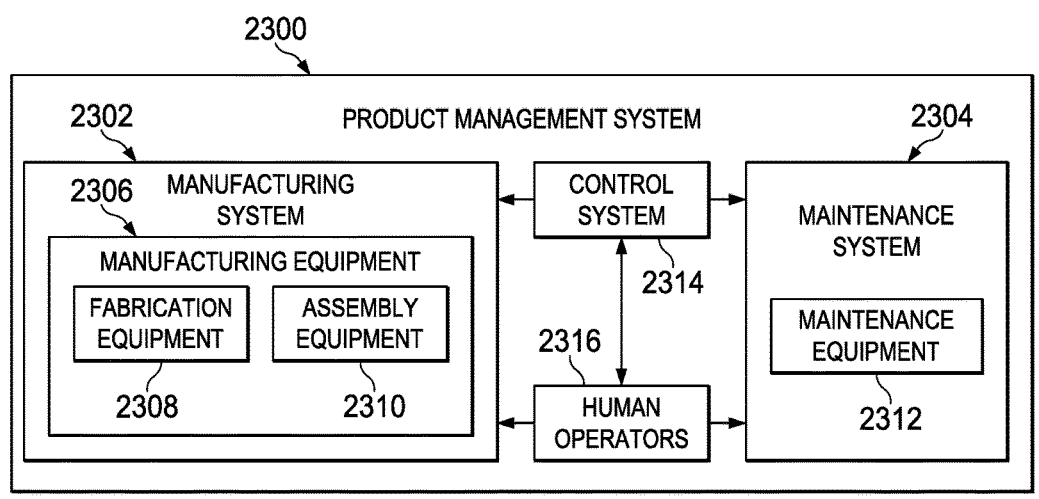
FIG. 23 is an illustration of a block diagram of a product management system in accordance with an illustrative embodiment.

Turning now to FIG. 23, an illustration of a block diagram of a product management system is depicted in accordance with an illustrative embodiment. Product management system 2300 is a physical hardware system. In this illustrative example, product management system 2300 may include at least one of manufacturing system 2302 or maintenance system 2304.

Manufacturing system 2302 is configured to manufacture products, such as aircraft 2200 in FIG. 22. As depicted, manufacturing system 2302 includes manufacturing equipment 2306. Manufacturing equipment 2306 includes at least one of fabrication equipment 2308 or assembly equipment 2310.

Fabrication equipment 2308 is equipment that may be used to fabricate components for parts used to form aircraft 2200. For example, fabrication equipment 2308 may include machines and tools. These machines and tools may be at least one of a drill, a hydraulic press, a furnace, a mold, a composite tape laying machine, a vacuum system, a lathe, or other suitable types of equipment. Fabrication equipment 2308 may be used to fabricate at least one of metal parts, composite parts, semiconductors, circuits, fasteners, ribs, skin panels, spars, antennas, or other suitable types of parts.

Assembly equipment 2310 is equipment used to assemble parts to form aircraft 2200. In particular, assembly equipment 2310 may be used to assemble components and parts to form aircraft 2200. Assembly equipment 2310 also may include machines and tools. These machines and tools may be at least one of a robotic arm, a crawler, a faster installation system, a rail-based drilling system, or a robot. Assembly equipment 2310 may be used to assemble parts, such as seats, horizontal stabilizers, wings, engines, engine housings, landing gear systems, and other parts for aircraft 2200.

In this illustrative example, maintenance system 2304 includes maintenance equipment 2312. Maintenance equipment 2312 may include any equipment needed to perform maintenance on aircraft 2200. Maintenance equipment 2312 may include tools for performing different operations on parts on aircraft 2200. These operations may include at least one of disassembling parts, refurbishing parts, inspecting parts, reworking parts, manufacturing replacement parts, or other operations for performing maintenance on aircraft 2200. These operations may be for routine maintenance, inspections, upgrades, refurbishment, or other types of maintenance operations.

In the illustrative example, maintenance equipment 2312 may include ultrasonic inspection devices, x-ray imaging systems, vision systems, drills, crawlers, and other suitable device. In some cases, maintenance equipment 2312 may include fabrication equipment 2308, assembly equipment 2310, or both to produce and assemble parts that may be needed for maintenance.

Product management system 2300 also includes control system 2314. Control system 2314 is a hardware system and may also include software or other types of components. Control system 2314 is configured to control the operation of at least one of manufacturing system 2302 or maintenance system 2304. In particular, control system 2314 may control the operation of at least one of fabrication equipment 2308, assembly equipment 2310, or maintenance equipment 2312.

The hardware in control system 2314 may be using hardware that may include computers, circuits, networks, and other types of equipment. The control may take the form of direct control of manufacturing equipment 2306. For example, robots, computer-controlled machines, and other equipment may be controlled by control system 2314. In the illustrative example, rework of inconsistencies identified using aircraft inspection system 108 in FIG. 1 may be performed using robots or computer-controlled machines. In other illustrative examples, control system 2314 may manage operations performed by human operators 2316 in manufacturing or performing maintenance on aircraft 2200. For example, control system 2314 may assign tasks, provide instructions, display models, or perform other operations to manage operations performed by human operators 2316.

In these illustrative examples, aircraft inspection system 108 may be implemented in or for use with control system 2314 to manage at least one of the manufacturing or maintenance of aircraft 2200. As depicted, work orders, instructions, tasks, and other information may be provided by control system 2314 to manage operations performed by human operators 2316 perform operations with respect to information about inconsistencies found in aircraft 2200 using aircraft inspection system 108.

For example, aircraft inspector 118 on mobile device 112 in FIG. 1 may be used to identify inconsistencies that that may need rework during manufacturing or maintenance of aircraft 2200. These inconsistencies may be identified by using aircraft inspector 118, and information about these inconsistencies may be used to create work orders performed during at least one of manufacturing or maintenance of aircraft 2200.

In the different illustrative examples, human operators 2316 may operate or interact with at least one of manufacturing equipment 2306, maintenance equipment 2312, or control system 2314. This interaction may be performed to manufacture aircraft 2200.

Of course, product management system 2300 may be configured to manage other products other than aircraft 2200. Although product management system 2300 has been described with respect to manufacturing in the aerospace industry, product management system 2300 may be configured to manage products for other industries. For example, product management system 2300 may be configured to manufacture products for the automotive industry as well as any other suitable industries.

As a result, an inspector or some other person viewing the interior of the aircraft may more easily create a list of inconsistencies that are found during an inspection of the interior of the aircraft. The location of these inconsistencies may be more quickly and accurately identified as compared to current procedures used to mark and record inconsistencies. The use of a two-dimensional layout in conjunction with a three-dimensional view of the interior of the aircraft may be used to record information about the inconsistencies while the inspector is walking through the aircraft.

The use of the two-dimensional layout in conjunction with the three-dimensional view allows for the use of smaller mobile devices. This use of the smaller mobile devices may be more convenient when inspections are performed in tight surroundings where the use of a laptop computer with a mouse or other pointing device requiring a surface for operation is unavailable or difficult to find.

In the illustrative examples, a change in the three-dimensional view may be performed based on movement of the mobile device, such as a change in orientation detected by an inertial measurement unit. This movement is used to change the three-dimensional view. When the inspector finds the object and a three-dimensional view for which an inconsistency has been found in the aircraft, the inspector may use a finger to select that object to initiate a process for recording the information about the inconsistency. In this manner, an external user input device, such as a mouse, is unnecessary.

As a result, coordinates for the location of a part in the aircraft may be more easily identified along with other part information. This information may then be used to create a work order or other set of instructions to remedy the inconsistency.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An aircraft inspection system that comprises an aircraft inspector configured to:
 display a two-dimensional layout of passenger accommodations (LOPA) of an interior of an aircraft on a graphical user interface on a mobile device, such that the LOPA comprises a group of fixed features visible within the interior of the aircraft;
 establish, responsive to a selection, on an input system for the mobile device, of a fixed feature in the group of fixed features on the LOPA, a point-of-view at a distance from the fixed feature, for a three-dimensional view on the graphical user interface on the mobile device;

display a field-of-view in the three-dimensional view that comprises a group of objects that comprises the fixed feature;

change, in response to a movement of the mobile device, a direction of the field-of-view of the three-dimensional view from the point-of-view established by the selection of the fixed feature on the LOPA;

receive a selection, on the graphical user interface, of an object in the field-of-view;

responsive to the selection of the object, access, from a three-dimensional model of the aircraft, and display information about the object;

accept into the graphical user interface, inconsistency information about the object;

generate, based upon the inconsistency information, a rework list for the object; and display a first level of detail for the two-dimensional layout that is greater than a second level of detail for the two-dimensional layout, wherein the second level of detail is displayed by the aircraft inspector when a portion of the LOPA displayed in the first level of detail is selected.

2. The aircraft inspection system of claim 1, wherein the aircraft inspector is configured to detect the movement of the mobile device using an inertial measurement unit for the mobile device.

3. The aircraft inspection system of claim 1, wherein the aircraft inspector is configured to receive a user input to the graphical user interface identifying an inconsistency for the object in the group of objects in the three-dimensional view.

4. The aircraft inspection system of claim 3, wherein in receiving the user input to the graphical user interface identifying the inconsistency for the object in the group of objects in the three-dimensional view, the aircraft inspector is configured to:

identify a part identifier for a part corresponding to the object when the object is selected;

receive an identification of the inconsistency for the part; and wherein the aircraft inspection system is configured to store the part identifier for the part and the identification of the inconsistency.

5. The aircraft inspection system of claim 4, wherein the part identifier for the part and the identification of the inconsistency are stored as an entry in a rework list for the aircraft.

6. The aircraft inspection system of claim 4, further comprising the identification of the inconsistency comprising a description of the inconsistency.

7. The aircraft inspection system of claim 1, wherein the fixed feature is selected from one of a window, a door, or a stowage bin.

8. The aircraft inspection system of claim 1, wherein the two-dimensional layout is displayed using a webpage.

9. The aircraft inspection system of claim 1, wherein the interior is selected from at least one of: a crew area, or a flight deck.

10. The aircraft inspection system of claim 1, wherein the mobile device is selected from one of a mobile phone, a tablet computer, a laptop computer, a subnotebook, a convertible laptop computer, and a netbook.

11. An apparatus that comprises:

a mobile device that comprises a graphical user interface and is configured to display a two-dimensional layout of passenger accommodations (LOPA) of an interior of an aircraft; and an aircraft inspector configured to:

run, on the mobile device, the LOPA that comprises fixed features visible within the interior of the aircraft;

establish, responsive to a selection, on an input system for the mobile device, of a fixed feature in the fixed features on the LOPA, a point-of-view at a distance from the fixed feature, for a three-dimensional view on the graphical user interface on the mobile device;

display a field-of-view in the three-dimensional view that comprises a group of objects that comprise the fixed feature;

change, responsive to a movement of the mobile device, a direction of the field-of-view of the three-dimensional view from the point-of-view established by the selection of the fixed feature on the LOPA;

receive a user input to the graphical user interface that identifies an inconsistency for an object in the field of view;

responsive to a selection of the object, access, from a three-dimensional model of the aircraft, and display information about the object;

accept into the graphical user interface, inconsistency information about the object;

generate, based upon the inconsistency information, a rework list for the object; and display a first level of detail for the two-dimensional layout that is greater than a second level of detail for the two-dimensional layout, and wherein the second level of detail is displayed by the aircraft inspector when a portion of the two-dimensional layout displayed in the first level of detail is selected.

12. The apparatus of claim 11, wherein the input system is selected from at least one of a touch screen or an inertial measurement unit.

13. The apparatus of claim 11, wherein in receiving the user input to the graphical user interface identifying the inconsistency for the object in the group of objects in the three-dimensional view, the aircraft inspector is configured to:

identify a part identifier for a part corresponding to the object when the object is selected;

receive an identification of the inconsistency for the part; and wherein the aircraft inspector is configured to store the part identifier for the part and the identification of the inconsistency.

14. A method for inspecting an aircraft, the method comprising:

displaying, by a processor unit in a mobile device, a two-dimensional layout of passenger accommodations (LOPA) of an interior of the aircraft on a graphical user interface on the mobile device in which the LOPA comprises fixed features visible within the interior of the aircraft;

displaying, by the processor unit and responsive to a selection on the LOPA of a fixed feature in the fixed features, a three-dimensional view, of a group of objects that comprises the fixed feature in the aircraft, on the graphical user interface on the mobile device from a point-of-view at a selected distance from an object in the group of objects;

changing, by the processor unit, a direction of a field-of-view from the point-of-view, established by the selection of the fixed feature on the LOPA, of the three-dimensional view in response to movement of the mobile device;

wherein an aircraft inspector displays a first level of detail for the two-dimensional layout that is less than a second level of detail for the two-dimensional layout;

receiving a user input to the graphical user interface identifying an inconsistency for the object in the field-of-view;

responsive to a selection of the object, accessing, from a three-dimensional model of the aircraft, and displaying information about the object;

accepting into the graphical user interface, inconsistency information about the object;

generating, using the inconsistency information, a rework list for the object; and displaying the second level of detail by the aircraft inspector when a portion of the two-dimensional layout displayed in the first level of detail is selected.

15. The method of claim 14, wherein the movement of the mobile device is detected using an inertial measurement unit for the mobile device.

16. The method of claim 14, wherein an aircraft inspector receives a user input to the graphical user interface identifying an inconsistency for the object in the group of objects in the three-dimensional view.

17. The method of claim 16, wherein in receiving the user input to the graphical user interface identifying the inconsistency for the object in the group of objects in the three-dimensional view comprises: identifying a part identifier for a part corresponding to the object when the object is selected; receiving an identification of the inconsistency for the part; and storing the part identifier for the part and the identification of the inconsistency.

18. The method of claim 17, wherein the part identifier for the part and the identification of the inconsistency are stored as an entry in the rework list for the aircraft.

19. The method of claim 17, wherein the identification of the inconsistency is selected from at least one of coordinates of a location of the inconsistency on the part or a description of the inconsistency.

20. The method of claim 14, wherein the fixed feature is selected from one of: a window, stowage bin, a wall, a light, a door, a sign, or a closet.

21. The method of claim 14, wherein the interior is selected from at least one of a passenger area, a crew area, or a flight deck.

22. The method of claim 14, wherein the mobile device is selected from one of a mobile phone, a tablet computer, a laptop computer, a subnotebook, a convertible laptop computer, and a netbook.

* * * * *

UNITED STATES PATENT AND TRADEMARK OFFICE
CERTIFICATE OF CORRECTION

PATENT NO. : 10,155,596 B2
APPLICATION NO. : 15/174354
DATED : December 18, 2018
INVENTOR(S) : Senesac It is certified that error appears in the above-identified patent and that said Letters Patent is hereby corrected as shown below:

In the Claims

Column 25, Line 25, herein change 'an aircraft inspector" to read as -the aircraft inspector-
Column 25, Line 26, herein change 'a user input' to read as -the user input-
Column 25, Line 27, herein change 'an inconsistency' to read as -the inconsistency- Signed and Sealed this
Twenty-third Day of April, 2019

Andrei Iancu
*Director of the United States Patent and Trademark Office*